US005958611A

United States Patent [19]
Ohta et al.

[11] Patent Number: 5,958,611
[45] Date of Patent: Sep. 28, 1999

[54] MAGNETIC MULTILAYERED FILM, MAGNETORESISTANCE EFFECT ELEMENT AND MAGNETORESISTANCE DEVICE

[75] Inventors: Manabu Ohta; Kiyoshi Noguchi; Masashi Sano, all of Saku; Satoru Araki, Chiba; Taro Oike, Saku, all of Japan

[73] Assignee: TDK Corporation, Tokyo, Japan

[21] Appl. No.: 08/873,739

[22] Filed: Jun. 12, 1997

[30] Foreign Application Priority Data

Jun. 14, 1996 [JP] Japan ..................................... 8-175490

[51] Int. Cl.$^6$ ....................................................... G11B 5/66
[52] U.S. Cl. ............... 428/692; 428/694 T; 428/693 TS; 428/694 TM; 428/141; 428/900; 360/113
[58] Field of Search ................................. 428/692, 634 T, 428/634 TS, 634 TM, 900, 141; 360/113

[56] References Cited

U.S. PATENT DOCUMENTS 4,949,039  8/1990  Gruenberg ............................... 324/252

FOREIGN PATENT DOCUMENTS 05347013  12/1993  Japan .
5-347013  12/1993  Japan .

OTHER PUBLICATIONS

B. Dieny, et al., "Giant Magnetoresistance In Soft Ferromagnetic Multilayers", Physical Review B, vol. 43, No. 1, Jan. 1, 1991, pp. 1297–1300.

H. Sakakima, et al. "Magnetoresistance in [Cu/{Fe–Mn/M/Cu/M}] Spin–Valve Multilayers (M=$Ni_{80}Fe_{15}Co_5$, $Ni_{80}Co_{20}$, $Co_{90}Fe_{10}$)", Jpn. J. Appl. Phys., vol. 32, Part 2, No. 10A, Oct. 1, 1993, pp. 1441–1443.

T. Lin, et al. "Improved Exchange Coupling Between Ferromagnetic Ni–Fe and Antiferromagnetic Ni–Mn–Based Films", J. Appl. Phys. Lett., vol. 65, No. 9, Aug. 29, 1994, pp. 1183–1185.

F. Koike, et al., "Spin Valve GMR Films with Antiferromagnetic $\sigma$–$Fe_2O_3$ Film", Journal of Jpn. Appl. Mag., vol. 20, No. 2, 1996, pp. 365–368.

*Primary Examiner*—Leszek Kilman
*Attorney, Agent, or Firm*—Oblon, Spivak, McClelland, Maier & Neustadt, P.C.

[57] ABSTRACT

According to the present invention, a magnetic multilayered film includes an oxide antiferromagnetic layer, a pinned ferromagnetic layer which is pinned by the oxide antiferromagnetic layer, a non-magnetic metal layer and a free ferromagnetic layer which are stacked on a substrate in order. A surface roughness Ra of the oxide antiferromagnetic layer at the side of the pinned ferromagnetic layer is set to no greater than 0.6 nm, and a crystal grain size D of the oxide antiferromagnetic layer is set to a value in the range of 10 to 40 nm. Thus, the magnetic multilayered film has the large exchange-coupling magnetic field and MR ratio and MR sensitivity. The magnetic multilayered film may be applied to a magnetoresistance effect element which may also applied to a magnetoresistance device, such as, a magnetoresistance effect type head. The magnetoresistance effect element having such a magnetic multilayered film is capable of obtaining high outputs. The magnetoresistance effect type head having such a magnetoresistance effect element which is excellent in current efficiency and capable of detecting signals magnetically recorded in high density, particularly in ultrahigh density exceeding 3 Gbit/inch$^2$ and further obtaining large outputs.

19 Claims, 9 Drawing Sheets

APPLIED MAGNETIC FIELD H (Oe)

MAGNETIC MULTILAYERED FILM, MAGNETORESISTANCE EFFECT ELEMENT AND MAGNETORESISTANCE DEVICE

BACKGROUND OF THE INVENTION

1. Field of the Invention

The present invention relates, in a magnetoresistance effect element for detecting the magnetic field from a magnetic recording medium or the like as a signal, to a magnetic multilayered film capable of detecting a small magnetic field change as a greater electrical resistance change signal, and further relates to the magnetoresistance effect element using such a magnetic multilayered film and to a magnetoresistance device using such a magnetoresistance effect element.

2. Deescription of the Prior Art

Recently, there has been the developing for increasing the recording density in magnetic recording and, following this, magnetoresistance effect type heads (hereinafter referred to as MR heads) using magnetoresistance change have been actively developed. The MR heads are designed to detect external magnetic field signals on the basis of the variation in resistance of a detecting sensor portion made of a magnetic material. The MR heads have an advantage that a high output signal can be obtained in high recording density because the reproduced output signal does not depend on the relative velocity of the heads to the magnetic recording medium.

$Ni_{80}Fe_{20}$ (Permalloy) is mainly used as the MR head material for high density magnetic recording at present. This material converts the change of a leaking magnetic field from a magnetic recording medium into the change of electrical resistance caused by an anisotropic magnetoresistance effect. However, a magnetoresistance change ratio $\alpha R/R$ (MR ratio) is in the range of 1 to 3% at most, and further, an MR ratio per unit magnetic field, that is, an MR sensitivity, is as small as about 0.05%/Oe, thereby resulting in reduction of the signal to noise ratio (S/N) for the recording density of no less than 3 GBPI (Giga Bit Per Inch$^2$). Therefore, the MR head material with the higher MR sensitivity will be needed.

Attention has been recently paid to artificial lattices having the structure in which thin films of metal having a thickness of an atomic diameter order are periodically stacked, because their behavior is different from that of bulk metal. One of such artificial lattices is a magnetic multilayered film having ferromagnetic metal thin films and non-magnetic metal thin films alternately deposited on a substrate. Heretofore, magnetic multilayered films of Fe/Cr, Co/Cu, NiFe/Cu and other types have been known. Among these materials, the iron-chromium (Fe/Cr) type was reported to exhibit a magnetoresistance change which exceeds 40% at an extremely low temperature (4.2 K). However, this is not commercially applicable because the external magnetic field at which a maximum resistance change occurs (operating magnetic field ), is as high as ten to several tens of kilo-oersted. Additionally, there have been proposed artificial lattice magnetic multilayered films of Co/Ag or the like, which, however, also require high operating magnetic field. On the other hand, the NiFe/Cu type requires the operating magnetic field which is as low as no greater than 500 Oe, however, the MR sensitivity thereof is 0.5%/Oe at most.

Furthermore, in case of MR heads, etc., there are some cases where a laminate structure is complicated, and thermal treatments such as baking, curing, etc. of resist materials are required in a fabrication process, a flattening process, etc., so that thermal stability for a temperature of about 250° C. is required for the MR materials. However, such a thermal treatment deteriorates the characteristics in the artificial lattice magnetic multilayered films.

Under these circumstances, a new structure which is called a spin valve has been proposed. In this structure, a non-magnetic layer is sandwiched by two kinds of magnetic layers of a free ferromagnetic layer and a pinned ferromagnetic layer made of NiFe or the like, and an antiferromagnetic layer made of FeMn or the like is further formed adjacent to the pinned ferromagnetic layer. In this case, since the FeMn layer and the adjacent pinned ferromagnetic layer are directly magnetic exchange-coupled to each other, the direction of the magnetic spin of the pinned ferromagnetic layer is fixed in the range of several tens to several hundreds Oe in magnetic field. On the other hand, the direction of the magnetic spin of the free ferromagnetic layer is freely varied by an external magnetic field. As a result, there can be achieved a magnetoresistance change ratio (MR ratio) of 2 to 5% in a small magnetic field range and the MR sensitivity of 0.6 to 1%. The following papers have been published relating thereto:

a. Physical Review B, 43 (1991) 1297

Si/Ta(5)/NiFe(6)/Cu(2)/NiFe(4.5)/FeMn(7)/Ta(5) [parenthesis represents film thickness (unit nm) of each layer, also applied hereinafter] is reported to exhibit that its MR ratio sharply rises up to 5.0% at an applied external magnetic field of 10 Oe.

b. Japanese Journal of Applied Physics, 32 (1993) L1441

The MR ratio is reported when the multilayer structure is adopted in the above paper a. In this multilayer structure, the structure of NiFe(6)/Cu(2.5)/NiFe(4)/FeMn(5) is laminated so as to sandwich Cu therebetween.

c. Applied Physics Letters, vol. 65, 1183 (1994)

The magnitude and stability of unidirectional anisotropy are reported when a laminated structure is formed by FeMn, NiMn or the like, as an exchange-coupling film, and NiFe.

d. U.S. Pat. No. 4,949,039

It is described that a larger MR effect can be obtained by forming ferromagnetic thin films through a non-magnetic intermediate layer so as to be arranged in antiparallel to each other. In addition, it describes a structure in which an antiferromagnetic material is disposed adjacent to one of the ferromagnetic layers.

In the spin valve magnetic multi layered films shown in the foregoing papers, the MR ratio is lower than the structure of Fe/Cr, Co/Cu, Co/Ag, NiFe/Cu or the like. However, the MR curve varies sharply at the applied magnetic field no greater than several tens Oe, so that it is suitably usable as an MR head material for a recording density no less than 3 Gbit/inch$^2$. Further, the spin valve film achieves the large MR effect by carrying out pinning with the antiferromagnetic layer adjacent to one of the two magnetic layers. Thus, the role of the antiferromagnetic layer is important and its reliability is extremely important. However, in case of FeMn mainly used at present, the Neel temperature is low, that is, about 150° C., so that it is insufficient in practice. Further, since FeMn is liable to corrosion, there is a big problem in manufacturing process. Further, when a metal thin film having a low resistivity is used for the antiferromagnetic layer, a shunted portion of the current flowing in the element becomes large so that it is necessary to feed the large current for achieving a given output. As a result, the element is subjected to a problem of heat or the like, which is not preferable.

For solving the foregoing problem, it has been proposed to use, as an antiferromagnetic layer, an oxide thin film made of NiO, $\alpha$-$Fe_2O_3$ or the like having a high resistivity.

e. Japanese Laid-Open Patent Publication No. Hei 5-347013

A magnetic recording/reproducing device using a spin valve film is described. Particularly, it is disclosed that nickel oxide is used for an antiferromagnetic film.

However, when nickel oxide is used, thermal stability is up to about 220° C., which is not sufficiently high. Further, there is a problem that the operating magnetic field margin is small due to a high coercive force of the pinned ferromagnetic layer.

f. Journal of Japan Applied Magnetics, 20, 365–368 (1996)

A spin valve GMR film was reported, wherein an $\alpha$-$Fe_2O_3$ film produced by an RF magnetron sputtering method was used as an antiferromagnetic film.

In this report, a magnetic multilayered film has a structure where $\alpha$-$Fe_2O_3$/NiFe/Cu/NiFe are stacked in order from a substrate. In this magnetic multilayered film, a pinned ferromagnetic layer and a free ferromagnetic layer are both NiFe layers, while the antiferromagnetic layer is the $\alpha$-$Fe_2O_3$ layer. This magnetic multilayered film has the same film structure as that of the magnetic multilayered film exhibiting the spin valve type GMR effect. However, as shown in FIG. 2 of this report, this magnetic multilayered film shows the GMR characteristic due to the difference in coercive force which is different from the conventionally reported spin valve type GMR film. Specifically, the oxide antiferromagnetic layer $\alpha$-$Fe_2O_3$ is used for increasing a coercive force of the pinned ferromagnetic layer NiFe due to exchange coupling between the oxide antiferromagnetic layer $\alpha$-$Fe_2O_3$ and the adjacent pinned ferromagnetic layer NiFe. This function of the antiferromagnetic layer is different from that of the conventional spin valve type. This GMR characteristic is quite different from that of the present invention which will be described later. Thus. although the apparent film structures are similar to each other between the spin valve film in the report and that of the present invention, the essential functions of the films totally differ from each other.

In general, the magnetoresistance (MR) characteristic of the spin valve film exhibits changes as shown in FIG. 3 (described later in detail). If an exchange biasing magnetic field generated by exchange coupling at the ferromagnetic layer/antiferromagnetic layer interface between the pinned ferromagnetic layer 40 and the antiferromagnetic layer 50 and magnetic interaction between the free ferromagnetic layer and the pinned ferromagnetic layer are represented by Hex, and coercive force of the pinned ferromagnetic layer at this time is represented by Hc1, it is necessary to satisfy the condition of Hex>Hc1. Unless this condition is satisfied, there is raised a problem that hysteresis is increased to cause higher noise level upon operating the element.

There has been a problem that, when the oxide antiferro magnetic layer is used for pinning the ferromagnetic layer, Hex becomes lower as compared with a case where a metal antiferromagnetic layer made of FeMn, NiMn or the like is used. Further, in order to obtain the sufficiently excellent exchange coupling at the ferromagnetic layer/antiferromagnetic layer interface, it is necessary to form the oxide antiferromagnetic layer having an excellent crystalline property. In general, in order to obtain an oxide thin film having the excellent crystalline property, its thickness should be several hundreds Å or more. Therefore, when using the oxide antiferromagnetic layer for pinning the ferromagnetic layer, it is necessary to form the pinned ferromagnetic layer/the non-magnetic layer/the free ferromagnetic layer in order on the oxide antiferromagnetic layer in view of the MR element structure and the film characteristic.

However, if the oxide antiferromagnetic layer becomes too thick, the coercive force Hc1 of the pinned ferromagnetic layer increases so much that the condition of Hex>Hc1 can not be satisfied. Further, there is another problem that coercive force Hc2 and the anisotropic magnetic field of the upper-positioned free ferromagnetic layer also increase so that the high MR sensitivity can not be achieved. In an MR head as shown in FIG. 4 (described later in detail), a spin valve film (magnetic multilayered film) 200 and an insulation film 400 are disposed between shield films 300, and the recording density is determined by a shield gap interval. Accordingly, if the whole thickness of the spin valve film is increased, it is not preferable also in view of ultrahigh density recording and reproduction. Therefore, it is required that the oxide antiferromagnetic layer is as thin as possible and is still provided with the given necessary characteristic. That is, when applying the spin valve film using the oxide antiferromagnetic layer to the MR head or the like, it is necessary to form the oxide antiferromagnetic layer which can provide the sufficiently large exchange-biasing magnetic field Hex with the minimum thickness thereof.

The present invention has been made in view of the above situation, and its object is to provide the oxide antiferromagnetic layer showing practically sufficient reliability, and provide the magnetic multilayered film having a high MR ratio, a linear MR change rise-up characteristic in an extremely small magnetic field range of about –10 Oe to 10 Oe and a high magnetic field sensitivity, and further provide a magnetoresistance effect element using such a magnetic multilayered film, and a magnetoresistance device, such as a magnetoresistance effect type head, using such a magnetoresistance effect element.

SUMMARY OF THE INVENTION

For solving the foregoing problems, the present inventors have assiduously researched about an exchange-coupling film of ferromagnetic layer/antiferromagnetic layer and a spin valve film using an oxide antiferromagnetic layer, and as a result, found out that a sufficiently large exchange biasing magnetic field can be obtained even with the thin oxide antiferromagnetic layer of no greater than 50 nm by setting a surface roughness and a crystal grain size of the oxide antiferromagnetic layer to given values, respectively, and reached the present invention.

According to one aspect of the present invention, a magnetic multilayered film comprises an oxide antiferromagnetic layer, a pinned ferromagnetic layer which is pinned by the oxide antiferromagnetic layer, a non-magnetic metal layer and a free ferromagnetic layer which are stacked on a substrate in order, wherein the surface roughness Ra of the oxide antiferromagnetic layer at a side of the pinned ferromagnetic layer is set to no greater than 0.6 nm, and wherein the crystal grain size D of the oxide antiferromagnetic layer is set to 10 to 40 nm.

According to another aspect of the present invention, a magnetoresistance effect element comprises the magnetic multilayered film and electrode portions provided at both ends of the magnetic multilayered film, the magnetic multilayered film comprising the oxide antiferromagnetic layer, the pinned ferromagnetic layer which is pinned by the oxide antiferromagnetic layer, the non-magnetic metal layer and the free ferromagnetic layer which are stacked on a substrate in order, wherein the surface roughness Ra of the oxide antiferromagnetic layer at a side of the pinned ferromagnetic layer is set to no greater than 0.6 nm, and wherein the crystal grain size D of the oxide antiferromagnetic layer is set to 10 to 40 nm.

According to another aspect of the present invention, a magnetoresistance device comprises the magnetic multilayered film, conductive films and the electrode portions, the conductive films electrically connected to the magnetic multilayered film via the electrode portions, respectively, the magnetic multilayered film comprising the oxide antiferromagnetic layer, the pinned ferromagnetic layer which is pinned by the oxide antiferromagnetic layer, the non-magnetic metal layer and the free ferromagnetic layer which are stacked on a substrate in order, wherein the surface roughness Ra of the oxide antiferromagnetic layer at a side of the pinned ferromagnetic layer is set to no greater than 0.6 nm, and wherein the crystal grain size D of the oxide antiferromagnetic layer is set to 10 to 40 nm.

DETAILED DESCRIPTION OF THE INVENTION

Hereinbelow, the concrete structures of the present invention will be described in detail.

Figure 1:
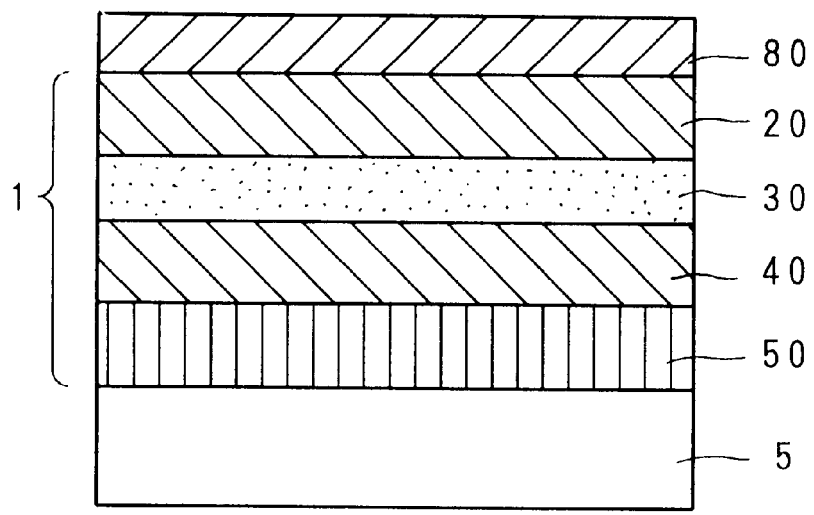
FIG. 1 is a cross-sectional view of a magnetic multilayered film according to the present invention.

FIG. 1 is a schematic sectional view of a magnetic multilayered film 1 according to an embodiment of the present invention.

In FIG. 1, the magnetic multilayered film 1 has a laminate body structure which includes an oxide antiferromagnetic layer 50, a pinned ferromagnetic layer 40 to be pinned by the oxide antiferromagnetic layer 50, a non-magnetic metal layer 30 and a free ferromagnetic layer 20 which are stacked in the order named. As shown in FIG. 1, the laminate body is formed on a substrate 5, and a protective layer 80 is normally formed on the free ferromagnetic layer 20. Further, at both ends of the magnetic multilayered film 1 are formed hard magnetic films for magnetic domain control, electrode films (lead films) and the like to constitute a magnetoresistance effect element (see FIG. 8).

In this invention, it is required that the free ferromagnetic layer 20 and the pinned ferromagnetic layer 40 which are formed at both sides of the non-magnetic metal layer 30 so as to be adjacent to the non-magnetic metal layer 30 have substantially different magnetization directions from each other in accordance with a signal magnetic field applied from the external. The reason is as follows: In the principle of the present invention, when the magnetization directions of the free ferromagnetic layer 20 and the pinned ferromagnetic layer 40 which are formed through the non-magnetic metal layer 30 are deviated from each other, conduction electrons have the behavior of scattering due to spins to increase its resistance. In this case, when the magnetization directions are opposite to each other, the resistance become maximum. That is, in this invention, when the signal magnetic field from the external is positive (in an upward direction with respect to the recording surface 93 of a magnetic recording medium 90 (represented by reference numeral 92)) as shown in FIG. 2, there occur components in the free ferromagnetic layer 20 and the pinned ferromagnetic layer 40 whose magnetization directions are antiparallel to each other, so that the resistance is increased.

Here, the relationship among the external signal magnetic field from the magnetic recording medium, the magnetization directions of the free ferromagnetic layer 20 and the pinned ferromagnetic layer 40 and the variation of electrical resistance will be described.

Now, in order to facilitate the understanding of the present invention, the simplest magnetic multilayered film in which a pair of the free ferromagnetic layer 20 and the pinned ferromagnetic layer 40 exist through the non-magnetic metal layer 30 as shown in FIG. 1 will be described with reference to FIGS. 2 and 3.

Figure 2:
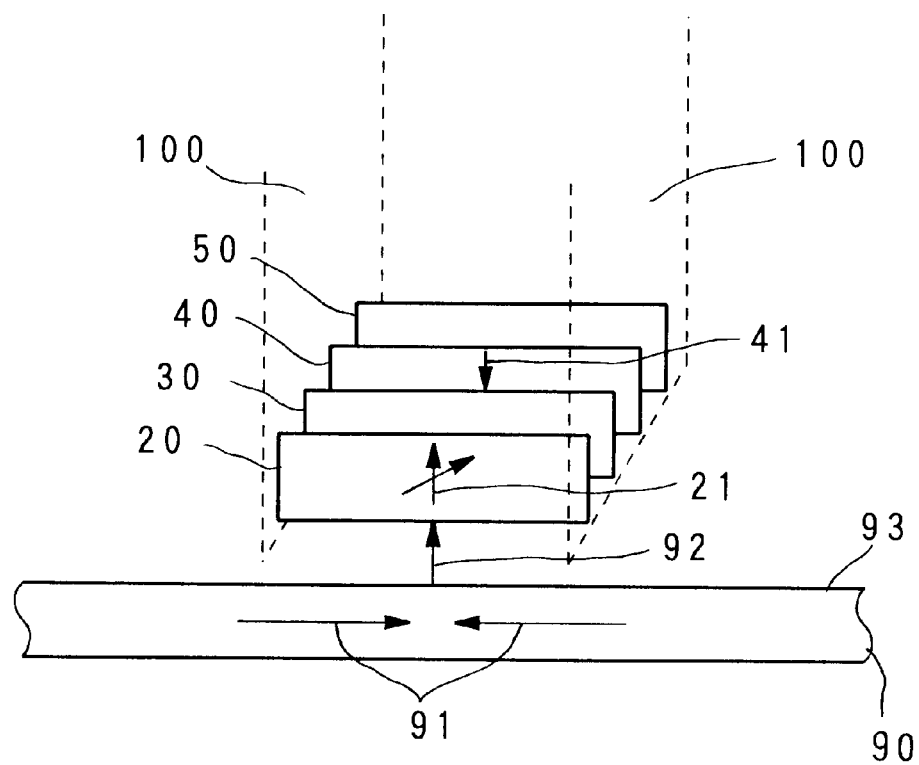
FIG. 2 is a schematic diagram showing a magnetoresistance effect element, particularly, a structure of a magnetic multilayered film, to explain an operation of the present invention.
Figure 3:
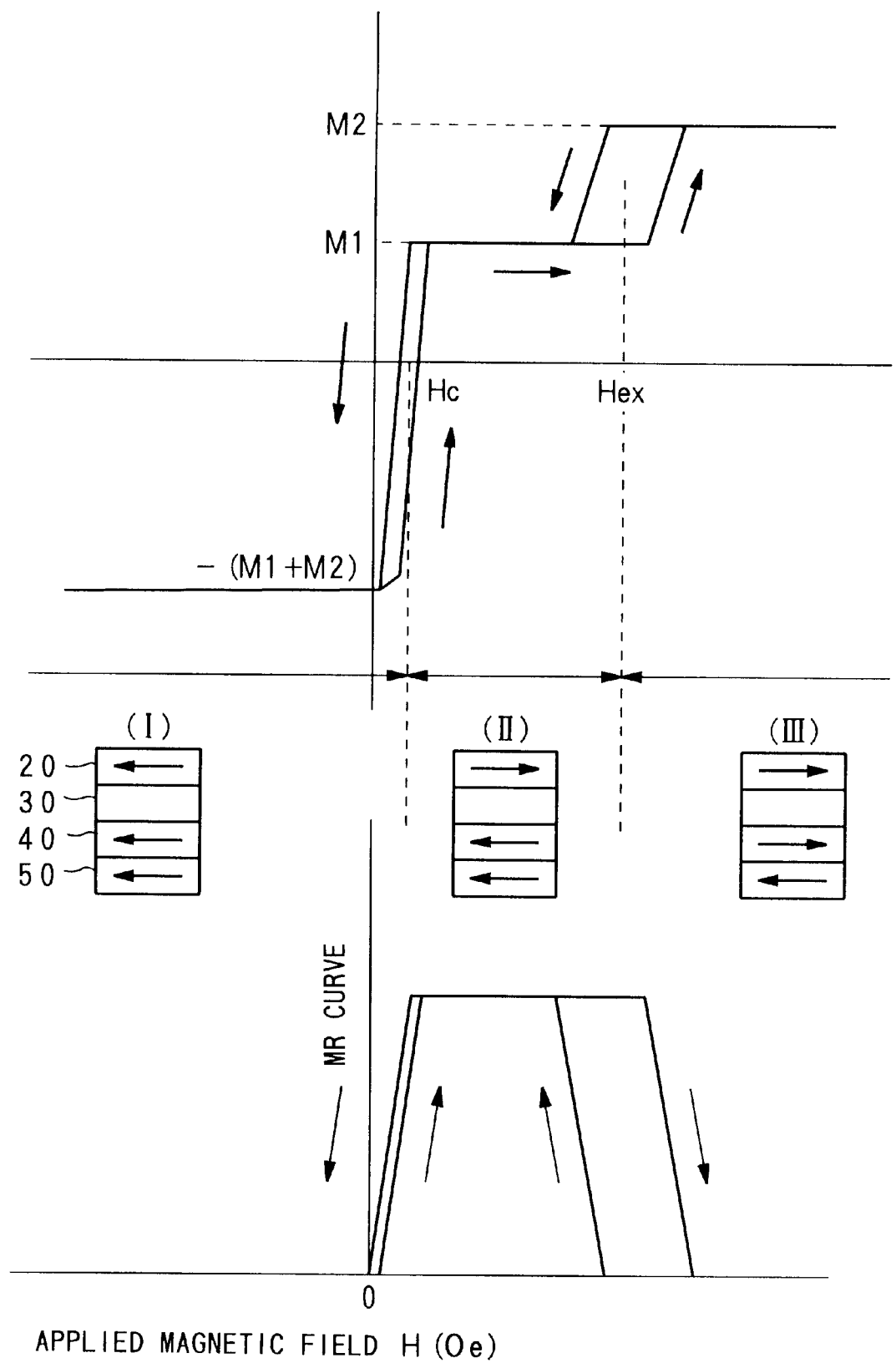
FIG. 3 is a schematic diagram showing a magnetization curve and an MR curve to explain an operation of the present invention.

As shown in FIG. 2, the magnetization of the pinned ferromagnetic layer 40 is pinned in a downward direction to the surface of the magnetic recording medium by a method as described later (reference numeral 41). The free ferromagnetic layer 20 is formed through the non-magnetic metal layer 30, so that the magnetization direction thereof is varied in accordance with the magnetic field from the external (reference numeral 21). At this time, the relative angle between the magnetization directions of the free ferromagnetic layer 20 and the pinned ferromagnetic layer 40 is greatly varied in accordance with the direction of the signal magnetic field from the magnetic recording medium 90. As a result, the scattering degree of the conduction electrons flowing in the magnetic layers is varied, and thus the electrical resistance is greatly varied.

Accordingly, a large MR (Magneto-Resistive) effect, which is substantially different in mechanism from the anisotropic magnetoresistance effect of ordinary Permalloy, can be obtained.

The magnetization directions of the free ferromagnetic layer 20 and the pinned ferromagnetic layer 40 are varied relative to the external magnetic field. The variation of the magnetization directions thereof is shown in FIG. 3 in correspondence with the magnetization curve and the MR curve. In this case, all the magnetization of the pinned ferromagnetic layer 40 is fixed in a minus direction (in a downward direction with respect to the recording surface of the magnetic recording medium 90) by the oxide antiferromagnetic layer 50. When the external signal magnetic field is minus, the magnetization of the free ferromagnetic layer 20 is in the minus direction. Now, it is assumed that the coercive force of each of the free ferromagnetic layer 20 and the pinned ferromagnetic layer 40 is approximate to zero in order to simplify the description. In an area (I) where the signal magnetic field H<0, the magnetization of both the free ferromagnetic layer 20 and the pinned ferromagnetic layer 40 is in one direction.

When the external magnetic field is intensified and H exceeds the coercive force of the free ferromagnetic layer 20, the magnetization direction of the free ferromagnetic layer 20 is rotated in the direction of the signal magnetic field, so that the magnetization and the electrical resistance are increased as the magnetization directions of the free ferromagnetic layer 20 and the pinned ferromagnetic layer 40 become antiparallel to each other. Finally, these values are fixed (state of an area (II)). At this time, a certain exchange biasing magnetic field Hex is applied to the pinned ferromagnetic layer 40 due to the unidirectional anisotropy field from the oxide antiferromagnetic layer 50 and the magnetic interaction between the free ferromagnetic layer 20 and the pinned ferromagnetic layer 40. If the signal magnetic field exceeds Hex, the magnetization of the pinned ferromagnetic layer 40 is also rotated in the direction of the signal magnetic field, so that the magnetization of each of the free ferromagnetic layer 20 and the pinned ferromagnetic layer 40 is oriented in the same direction in an area (III). At this time, the magnetization is set to a constant value, and the MR curve is equal to zero.

Conversely, when the signal magnetic field H is reduced, the magnetization is changed from the area (III) through the area (II) to the area (I) by inversion of the magnetization of the free ferromagnetic layer 20 and the pinned ferromagnetic layer 40 in the same manner as described above. At an initial portion of the area (II), the conduction electrons have the behavior of scattering dependent on spins, and the resistance is increased. In the area (II), the pinned ferromagnetic layer 40 has little magnetization inversion because it is pinned, while the magnetization of the free ferromagnetic layer 20 increases linearly, so that the rate of spin-dependent scattered conduction electrons is gradually increased in accordance with the magnetization change of the free ferromagnetic layer 20. That is, if $Ni_{80}Fe_{20}$ whose Hc is low is selected for the free ferromagnetic layer 20 and a suitable anisotropic magnetic field Hk is applied, the formed magnetic multilayered film has a linearly-varying resistance and a large magnetoresistance ratio in a small external magnetic field of several Oe to several tens Oe below Hk.

Hereinbelow, each constitution of the foregoing magnetic multilayered film 1 will be described in detail. The first feature of this magnetic multilayered film resides in constitution of the oxide antiferromagnetic layer 50.

The oxide antiferromagnetic layer 50 of the magnetic multilayered film in the present invention is used for pinning the magnetization of the adjacent pinned ferromagnetic layer 40. A surface roughness Ra of the oxide antiferromagnetic layer 50 at the side of the pinned ferromagnetic layer 40 is set in the range no greater than 0.6 nm. If this value exceeds 0.6 nm, the sufficiently large exchange biasing magnetic field Hex can not be achieved so that the sufficient pinning effect (exchange coupling) is not ensured. Ideally, it is preferable that the lower limit of the surface roughness Ra is set as small as possible. However, practically, it is set about 0.05 nm. The surface roughness Ra can be measured using atomic force microscope (AFM).

Further, a crystal grain size D of composition forming the oxide antiferromagnetic layer 50 is preferably in the range of 10 to 40 nm, and more preferably in the range of 20 to 40 nm. If the value of the crystal grain size D becomes less than 10 nm, the crystalline property of the antiferromagnetic layer 50 itself is deteriorated so that Hex is diminished. On the other hand, if the value of the crystal grain size D exceeds 40 nm, the coercive force Hc1 of the pinned ferromagnetic layer 40 formed on the oxide antiferromagnetic layer 50 is increased so that Hc1 is greater than Hua. Further, since the coercive force Hc2 and Hk of the free ferromagnetic layer 20 also increase, hysteresis of the MR element is increased to heighten noise and further deteriorate the magnetic field sensitivity. The magnitude of the crystal grain size D may be measured based on observation of an image by a TEM.

The oxide antiferromagnetic layer 50 in the present invention is made of metal oxide represented by FeOx or $(Co_{1-y}Ni_y)O$, wherein $1.40 \leq x \leq 1.55$, more preferably $1.42 \leq x \leq 1.50$, and $0.3 \leq y \leq 1$, more preferably $0.6 \leq y \leq 1$. Unit of x and y is the atomic ratio, respectively. If the value of x becomes less than 1.40 in FeOx, the thermal stability of the oxide antiferromagnetic layer 50 itself is deteriorated so that the oxide antiferromagnetic layer 50 is changed in phase to a spinel ferromagnetic layer (magnetite or the like). On the other hand, if the value of x exceeds 1.55, excessive oxygen diffuses into the adjacent pinned ferromagnetic layer 40 to increase the coercive force Hc1 of the pinned ferromagnetic layer 40. Further, if the value of y becomes less than 0.3 in $(Co_{1-y}Ni_y)O$, although the exchange-coupling magnetic field Hex in the room temperature increases, the blocking temperature is lowered with going down the Neel temperature so that Hex upon operation of the MR element (element temperature about 100° C.) is diminished. Hence, Barkhausen noise is generated.

It is preferable that the oxide antiferromagnetic layer 50 in the present invention is formed in an atmosphere of mixed gas of Ar (argon) and $O_2$ (oxygen), particularly, using an RF sputtering method. If the sputtering is performed in the atmosphere of pure Ar without oxygen, a target is reduced so that the formed film composition gradually loses oxygen so as to be deviated from the given film composition. Following this, a dispersion of Hex is caused so that excellent repeatability can not be obtained. If the amount of oxygen is increased, the crystal grain size D forming the film tends to be reduced. Therefore, by adjusting the mixture ratio of Ar and oxygen, the crystal grain size D of the oxide antiferromagnetic layer 50 can be adjusted to some extent.

The thickness of the oxide antiferromagnetic layer 50 is set to 8 nm to 100 nm, preferably 8 nm to 50 nm, and more preferably 8 nm to 30 nm. If the oxide antiferromagnetic layer 50 being the pinning layer becomes less than 8 nm in thickness, its crystalline property is deteriorated so that it does not show antiferromagnetism. On the other hand, if the oxide antiferromagnetic layer 50 becomes too thick, the coercive force Hc1 of the pinned ferromagnetic layer 40 is increased so that the condition of Hex>Hc1 can not be satisfied. Further, since the coercive force Hc2 and the anisotropic magnetic field of the upper-positioned free ferromagnetic layer 20 are also increased, the high MR sensitivity can not be achieved. Moreover, a gap length (a shield-shield length) of the MR head is so increased that it is not suitable for the ultrahigh density magnetic recording. Thus, the thickness of the oxide antiferromagnetic layer 50 is preferably less than 100 nm.

The foregoing pinned ferromagnetic layer 40 is preferably formed of a composition expressed by $Co_{100-z}Fe_z$ ($0 \leq z \leq 20$, more preferably $8 \leq z \leq 12$; unit: atomic %). If a value of z exceeds 20 atomic % in this composition, although the MR ratio is increased, a magnetostriction constant is also increased. Thus, the coercive force Hc1 of the pinned ferromagnetic layer 40 is increased, and the thermal stability of exchange coupling at the interface between the oxide antiferromagnetic layer 50 and the pinned ferromagnetic layer 40 is deteriorated.

The thickness of the pinned ferromagnetic layer 40 as described above is set to 0.6 to 10 nm, and more preferably 2 to 6 nm. If this value is smaller than 0.6 nm, it loses the characteristic as the magnetic layer. On the other hand, if the value exceeds 10 nm, the exchange biasing magnetic field from the oxide antiferromagnetic layer 50 is reduced, and thus the sufficient pinning effect of the spin of the ferromagnetic layer can not be obtained.

As described above, since the pinned ferromagnetic layer 40 is in direct abutment with the oxide antiferromagnetic layer 50, a direct interlayer interaction acts on each other, and the rotation of the magnetization of the pinned ferromagnetic layer 40 is prevented. On the other hand, with respect to the free ferromagnetic layer 20 as described later in detail, its magnetization can be freely rotated by the signal magnetic field from outside. As a result, a relative angle between both the free ferromagnetic layer 20 and the pinned ferromagnetic layer 40 is produced, so that a large MR effect due to the difference between the magnetization directions can be obtained.

The free ferromagnetic layer 20 is formed of Fe, Ni, Co or the like, or alloy or compound containing these elements. Although not specifically limited, the MR curve has less hysteresis and rises up more sharply by using the magnetic layer having a small coercive force Hc and a small anisotropic magnetic field Hk, and thus favorable results can be achieved. Particularly, a composition as expressed by $Ni_uFe_vCo_{100-u-v}$ ($20 \leq u \leq 90$, more preferably $50 \leq u \leq 85$, and $10 \leq v \leq 35$, more preferably $15 \leq v \leq 20$, unit of u and v: atomic %) is preferable. If values of u and v fall outside the foregoing ranges in this composition, since the magnetostriction constant is also increased, the coercive force Hc2 of the free ferromagnetic layer 20 is increased so that the large MR ratio and the high MR sensitivity can not be achieved.

The thickness of the free ferromagnetic layer 20 as described above is set to 2 to 15 nm, preferably 3 to 10 nm, and more preferably 3 to 5 nm. If this value is smaller than 2 nm, no excellent characteristic as the free ferromagnetic layer can be obtained. On the other hand, if the value exceeds 15 nm, the total thickness of the multilayered film becomes large and the resistance of the whole magnetic multilayered film is decreased, so that the MR effect is reduced.

In order to conduct electrons efficiently, metal having conductivity is preferably used for the non-magnetic metal layer 30 which is interposed between the free ferromagnetic layer 20 and the pinned ferromagnetic layer 40. More specifically, it may be formed of at least one kind selected from Au, Ag and Cu, alloy containing 60 weight % or more of at least one of these elements, or the like.

The thickness of the non-magnetic metal layer 30 is preferably set to 1.5 to 4 nm. If this value is smaller than 1.5 nm, the free ferromagnetic layer 20 and the pinned ferromagnetic layer 40 which are disposed through the non-magnetic metal layer are ferromagnetically exchange-coupled to each other, so that the spins of the free ferromagnetic layer 20 and the pinned ferromagnetic layer 40 do not function independently of each other. If this value exceeds 4 nm, the number of the electrons which are scattered at the interface between the free ferromagnetic layer 20 and the pinned ferromagnetic layer 40 disposed at the upper and lower sides respectively are reduced, so that the MR ratio is reduced.

It is necessary that the foregoing layers are laminated at least in the order of the oxide antiferromagnetic layer 50, the pinned ferromagnetic layer 40, the non-magnetic metal layer 30 and the free ferromagnetic layer 20 from the side of the substrate 5. This laminating order comes from the limitation of the oxide antiferromagnetic layer 50. Specifically, by first laminating the oxide antiferromagnetic layer 50 on the substrate 5, antiferromagnetism of the oxide antiferromagnetic layer 50 can be fully realized. Further, in view of achieving a greater MR ratio, a laminate structure, including the oxide antiferromagnetic layer, the pinned ferromagnetic layer, the non-magnetic metal layer, the free ferromagnetic layer, the non-magnetic metal layer, the pinned ferromagnetic layer and the oxide antiferromagnetic layer, on the substrate 5 is, of course, possible.

The protection layer 80 is provided to prevent oxidation of the surface of the magnetic multilayered film in a film-forming process and improve wettability with a shield gap insulation film formed thereon and adhesive strength. The protection layer 80 is formed of Ti, Ta, W, Cr, Hf, Zr or the like. The thickness thereof is generally set to about 3 to 30 nm.

The substrate 5 is formed of glass, alumina, silicon, MgO, GaAs, ferrite, AlTiC, $CaTiO_3$ or the like, and the thickness thereof is generally set to about 0.5 to 10 mm. It may be arranged that a film of alumina, $SiO_2$ or the like having a thickness of 30 to 300 nm is formed on the substrate 5, and then the magnetic multilayered film 1 is formed thereon in order.

The material of each layer and the thickness thereof are specified as described above, and an external magnetic field is applied in a direction within the film surface as described later at the film deposition time of at least the free ferromagnetic layer 20 to apply anisotropic magnetic field Hk of 2 to 20 Oe, preferably 2 to 16 Oe, and more preferably 2 to 10 Oe. With this operation, the magnetic multilayered film thus formed has an MR change curve in which an MR sensitivity at a rise-up portion is equal to 0.5%/Oe or more. The maximum hysteresis width of the MR change curve is equal to 8 Oe or less, usually 0 to 6 Oe. Accordingly, when it is used for an MR head or the like for the high-density recording, a sufficient performance can be obtained. If the anisotropic magnetic field Hk of the free ferromagnetic layer is lower than 2 Oe, it is equal to the same degree of the coercive force, and no linear MR change curve can be substantially obtained in the vicinity of zero magnetic field, so that the characteristic as the MR element is deteriorated. On the other hand, if it is higher than 20 Oe, the MR sensitivity becomes small and when this film is applied to the MR head or the like, an output level is liable to be reduced and a resolution is reduced. The value Hk as described above can be obtained by applying the external magnetic field of 10 to 300 Oe at the film deposition. If the external magnetic field is no greater than 10 Oe, it is too insufficient to induce Hk. On the other hand, if it exceeds 300 Oe, the effect is not improved although a coil must be designed in large size due to an occurrence of magnetic field. Therefore, the cost is increased and thus it is inefficient.

When the maximum resistivity is represented by $\rho max$ and the minimum resistivity is represented by $\rho sat$, the MR ratio is represented as $(\rho max - \rho sat) \times 100/\rho sat$ (%). The maximum hysteresis width corresponds to the maximum value of the hysteresis width which is calculated by measuring the magnetoresistance change curve (MR curve) at ±30 Oe. The MR sensitivity corresponds to the maximum value of differential values at −20 Oe to +20 Oe which is obtained by measuring the MR curve and calculating a differential curve.

The magnetic multilayered film 1 may be repeatedly laminated to form the magnetoresistance effect element. In this case, the repetitive lamination pepiod N of the magnetic multilayer film is not limited to a specific value, and it may be suitably selected in accordance with a desired magnetoresistance ratio, etc. In order to satisfy the present requirement for ultrahigh density of the magnetic recording, the smaller total film thickness of the magnetic multilayered film is better. However, if the film is thinner, the MR effect is usually reduced. The magnetic multilayered film of this invention can be used in practice to a sufficient level, even when the repetitive lamination period N is 1. Furthermore, as the lamination period is increased, the magnetoresistance ratio increases while productivity become worse. If N is excessively large, the resistance of the whole element is excessively low, and it is practically inconvenient. Therefore, usually, N is preferably set to 10 or less. The long-period structure of lattices can be confirmed on the basis of appearance of primary and secondary peaks in accordance with a repetitive period in a small-angle X-ray diffraction pattern. When it is applied to a magnetoresistance device such as the MR head or the like for ultrahigh density magnetic recording, N is preferably set to 1 to 5.

In order to minimize the repetitive lamination period N as much as possible, a structure having, from the side of the substrate, the oxide antiferromagnetic layer, the pinned ferromagnetic layer, the non-magnetic metal layer, the free ferromagnetic layer, the non-magnetic metal layer, the pinned ferromagnetic layer and the oxide antiferromagnetic layer, that is, having one free ferromagnetic layer and two oxide antiferromagnetic layers, is preferable.

The formation of the foregoing magnetic multilayered film 1 may be performed by an ion-beam sputtering method, a sputtering method, a deposition method, a molecular beam epitaxy (MBE) method or the like. On the other hand, as described before, the oxide antiferromagnetic layer 50 is preferably formed using the RF sputtering method.

As the substrate 5, glass, alumina, silicon, MgO, GaAs, ferrite, AlTiC, $CaTiO_3$ or the like may be used. Further, a film of alumina, $SiO_2$ or the like having a thickness of 100 to 300 nm is formed on the substrate 5 and then the magnetic multilayered film 1 is formed thereon in order. For the film preparation, it is preferable that an external magnetic field of 10 to 300 Oe is applied in a direction within the film plane upon the film preparation. With this operation, Hk can be provided to the free ferromagnetic layer 20. The application of the external magnetic field may be performed at only the film deposition the free ferromagnetic field 20, for example, using a device which is equipped with an electromagnet or the like which is capable of easily controlling an application timing of the magnetic field, and no external magnetic field is applied at the film formation time of the oxide antiferromagnetic layer 50. Alternatively, a method of applying a constant magnetic field at the film deposition time at all times may be used.

Next, the invention of the magnetic multilayered film 1 and the magnetoresistance effect element having the magnetic multilayered film 1 as described in the foregoing embodiment has been developed and a path through which electrons flow has been considered in detail, thereby achieving the invention of a magnetoresistance device. The magnetoresistance device as described here includes a magnetoresi stance effect element, conductive films and electrode portions. More specifically, it is a device which is expressed with a broad concept ion covering a magnetoresistance effect type head (MR head), an MR sensor, a ferromagnetic memory element, an angle sensor or the like.

In the following description, the magnetoresistance effect type head (MR head) will be picked up and described as an example of the magnetoresistance device.

Figure 4:
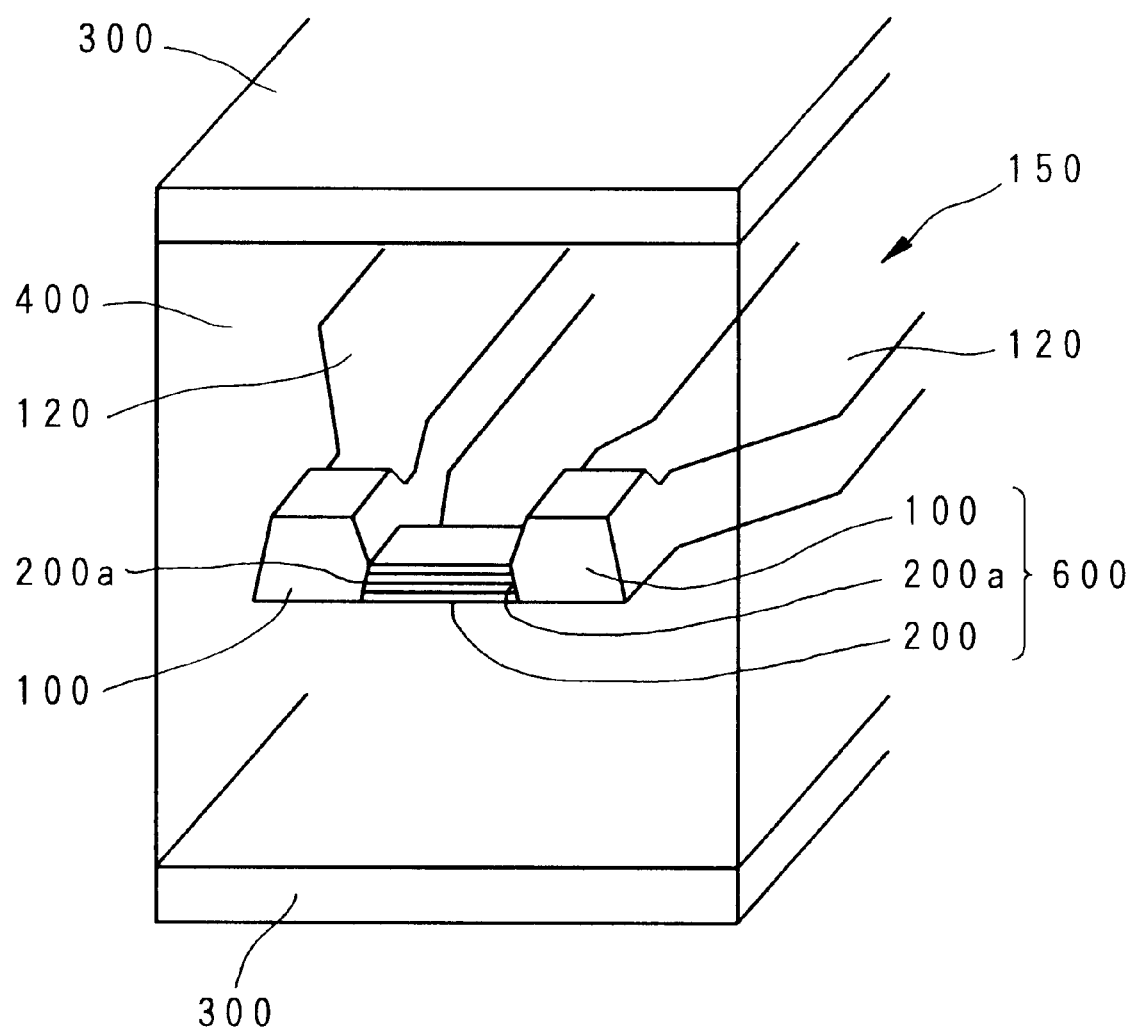
FIG. 4 is a partially omitted cross-sectional view showing an example of a magnetoresistance device according to the present invention.

As shown in FIG. 4, the magnetoresistance effect type head (MR head) 150 includes the magnetic multilayered film 200 serving as a magnetically-sensitive portion for magnetically sensing the signal magnetic field, and the electrode portions 100, 100 which are formed at both end portions 200a, 200a of the magnetic multilayered film 200 (numeral 600 including them represents the magnetoresistance effect element). Preferably, the whole both end portions 200a, 200a of the magnetic multilayered film 200 serving as the magnetically-sensitive portion are connected to the electrode portions 100, 100. The conductive films 120, 120 are electrically conducted to the magnetic multilayered film 200 through the electrode portions 100, 100. In this invention, the conductive film 120 and the electrode portion 100 are individually shown for convenience, while in most cases the conductive film 120 and the electrode portion 100 are formed integral with each other by a thin film deposition process. Accordingly, these elements may be considered as being formed of one member. The magnetic multilayered film 200 used in the magnetoresistance effect element 600 serving as the magnetically-sensitive portion of the MR head has substantially the same laminate structure as the magnetic multilayered film 1 shown in FIG. 1. That is, the magnetic multilayered film 200 is replaced by the magnetic multilayered film shown in FIG. 1, so that the magnetic multilayered film 200 includes the oxide antiferromagnetic layer 50, the pinned ferromagnetic layer 40 to be pinned by the oxide antiferromagnetic layer 50, the non-magnetic metal layer 30 and the free ferromagnetic layer 20 which are stacked in the order named.

The important point is that the thus the formed magnetoresistance effect element 600 exhibits the so-called spin-valve type magnetoresistance change. The spin-valve type magnetoresistance change represents that, in the magnetic multilayered film having the non-magnetic metal layer 30, the pinned ferromagnetic layer 40 formed on one surface of the non-magnetic metal layer 30, the free ferromagnetic layer 20 formed on the other surface of the non-magnetic metal layer 30 and the oxide antiferromagnetic layer 50 formed on the ferromagnetic layer for pinning the magnetization direction of the pinned ferromagnetic layer 40, an angle formed between the spin of the free ferromagnetic layer 20 and the spin of the pinned ferromagnetic layer 40 is set to approximately 90 degrees in an acute angle when the external signal magnetic field is zero. In practice, the angle may be 45 to 90 degrees, and preferably 60 to 90 degrees. Since the pinning action is achieved by the direct exchange interaction between the pinned ferromagnetic layer 40 and the oxide antiferromagnetic layer 50, and particularly, the direct exchange interact ion between the antiferromagnetic layer and the ferromagnetic layer in the present invention, the magnetoresistance effect curve (MR curve) is asymmetrical relative to the plus and minus external magnetic fields with respect to the zero external magnetic field.

As shown in FIG. 4, in the magnetoresistance effect type head (MR head) 150, shield layers 300, 300 are formed so as to sandwich the magnetoresistance effect element 600 at the upper and lower sides, and a shield gap insulation layer 400 is form ed at a portion between the magnetoresistance effect element 600 and the shield layers 300, 300.

The same materials and thicknesses as described in the foregoing embodiment of the magnetic multilayered film are preferably used for the pinned ferromagnetic layer 40, the non-magnetic metal layer 30, the free ferromagnetic layer 20 and the oxide antiferromagnetic layer 50 used in the magnetoresistance effect element 600 as the magnetically-sensitive portion.

The detailed review has been made on the path of current flowing in the magnetic multilayered film 200 of the magnetoresistance effect element 600, and as a result of the review, it has been found out that the electrons as current intensively flow through a certain portion in the magnetic multilayered film. Specifically, among the respective layers forming the magnetic multilayered film, iron oxide forming the oxide antiferromagnetic layer 50 is approximate to an insulation layer. Accordingly, the electrons intensively flow through the free ferromagnetic lever 20 and the non-magnetic metal layer 30 each having a low resistivity. In the MR head using the conventional spin-valve film, the non-magnetic metal layer, the pinned ferromagnetic layer and the antiferromagnetic layer are laminated in the order named after formation of a free ferromagnetic layer as a magnetically-sensitive portion, and then the electrode is formed on the upper surface of the antiferromagnetic layer. In this structure, the electrode is contacted with the antiferromagnetic layer having a quite large resistivity, so that it is difficult for sense current for measurement (constant current necessary for operating the MR head) to flow. Furthermore, the contact resistance is large and the yield on the manufacturing process is reduced.

These problems can be solved by reversing the a lamination order so as to arrange the oxide antiferromagnetic layer 50 approximate to the insulation layer to be closer to the substrate 5, and by designing the current-flowing electrode portions 100 so that both end portions 200a, 200a thereof are wholly contacted with the magnetic multilayered film 200 of the magnetoresistance effect element 600 in the laminate direction as shown in FIG. 4. Specifically, the electrons intensively flow through the portion sandwiched between the free ferromagnetic layer 20 and the pinned ferromagnetic layer 40. At this time, the electrons are magnetically scattered in accordance with the spin directions of the free ferromagnetic layer 20 and the pinned ferromagnetic layer 40, so that the resistance is greatly varied. Accordingly, a small change of the external magnetic field can be detected as a large change of electrical resistance.

As described above, at least at the film deposition process of the free ferromagnetic layer 20, the external magnetic field is applied in one direction within the film plane to induce the anisotropic magnetic field Hk, thereby making the high-frequency characteristic excellent. Here, the external magnetic field is applied in such a direction that an electric current flows to induce the MR effect in the magnetic multilayered film, thereby inducing the anisotropic magnetic field. Usually, the magnetic multilayered film is processed in a stripe pattern, and the electric current is control led to flow a long the longitudinal direction of the magnetic multilayered film. Therefore, it is best to perform the film formation while applying the magnetic field in the longitudinal direction. In other words, it is preferable that the film formation is performed while the magnetic field is applied in the same direction as the electric current flow of the MR head, that is, in a direction which is perpendicular to the signal magnetic field direction and is an in-plane direction. Accordingly, in the free ferromagnetic layer constituting the magnetic multilayered film in the shape of the stripe pattern, the longitudinal direction thereof becomes easy magnetic axis direction, and the short-side direction thereof becomes hard magnetic axis direction, so that anisotropic magnetic field Hk occurs. In this case, since the signal magnetic field is applied in the short-side direction of the magnetic multilayered film in the shape of the stripe pattern, the high-frequency magnetic characteristic of the free ferromagnetic layer is improved, and the large MR characteristic in a high frequency region can be obtained. It is preferable that the magnitude of the applied magnetic field is in the range of 10 to 300 Oe. The anisotropic magnetic field Hk which is induced in the free ferromagnetic layer 20 is in the range of 3 to 20 Oe, preferably 3 to 16 Oe, more preferably 3 to 12 Oe. If the anisotropic magnetic field Hk is lower than 3 Oe, it is equal to the same degree as the coercive force of the free ferromagnetic layer 20, so that no linear MR change curve can be substantially obtained in the vicinity of the zero magnetic field. Therefore, the characteristic as the MR head is deteriorated. On the other hand, if the anisotropic magnetic field Hk is higher than 20 Oe, the MR sensitivity (MR ratio per unit magnetic field) is reduced, so that the output level is liable to be reduced and the resolution is reduced when it is used as the MR head or the like.

Furthermore, when forming the oxide antiferromagnetic player 50, the magnetic field is preferably applied in the direction perpendicular to the direction of the magnetic field applied at the film formation time of the free ferromagnetic film 20. Specifically, it is applied within the film plane of the magnetic multilayered film 200 and in a direction orthogonal to the measurement current. The magnitude of the applied magnetic field is preferably set in the range of 10 to 300 Oe. With this operation, the magnetization direction of the pinned ferromagnetic layer 40 is surely fixed in the applied magnetic field direction (direction perpendicular to the measurement current) by the oxide antiferromagnetic layer 50, whereby the magnetization of the pinned ferromagnetic layer 40 can be most reasonably set to be antiparallel to the magnetization of the free ferromagnetic layer 20 whose direction can be freely changed by the signal magnetic field. However, this is not a necessary condition, and the direction of the magnetic field to be applied at the film deposition of the oxide antiferromagnetic layer 50 may be coincident with the direction of the magnetization of the magnetic field to be applied at the film deposition of the free ferromagnetic layer 20. At this time, it is preferable that the temperature is decreased while applying the magnetic field in the stripe short-side direction (direction perpendicular to the direction of the applied magnetic field when the free ferromagnetic layer 20 is formed), when the heat treatment at about 200° C. is carried out in the process after the magnetic multilayered film 200 is formed.

When manufacturing the MR head, heat treatments such as baking, annealing, resist curing, etc. are indispensable for a patterning process, a flattening process, etc. in the manufacturing process.

In general, a problem of heat-resistance frequently occurs in the magnetoresistance effect element having the magnetic multilayered film, which is called artificial lattices, due to the thickness of each layer. According to the magnetoresistance effect element (magnetic multilayered film) of the present invention, the magnetic field is applied to provide anisotropic magnetic field in the magnetic layer, so that, after the film formation, it can endure a heat treatment at a temperature 300° C. or less, generally 100 to 300° C. for about a few hours. The heat treatment is generally performed under vacuum, inert gas atmosphere, or atmospheric air. Particularly, if the heat treatment is conducted under a vacuum (pressure-reduced) state at $10^{-7}$ Torr or less, the magnetoresistance effect element (magnetic multilayered film) whose characteristic is extremely less deteriorated can be obtained. Furthermore, the MR characteristic is little deteriorated even by lapping or polishing in the processing step.

It may be arranged that, after formation of the oxide antiferromagnetic layer 50, the substrate is taken out from a vacuum chamber, then it is subjected to the heat treatment at temperature of 100° C. to 300° C. in the atmosphere, under oxygen or in the vacuum, and thereafter, the substrate is returned into the vacuum chamber so as to form the remaining spin-valve structure (remaining laminate film structure). In this case, it is preferable to form the remaining laminate film structure after removing moisture and the like adsorbed to the oxide antiferromagnetic layer 50 by sputter etching. Through the heat treatment, the characteristic in antiferromagnetism can be improved by the relaxation of the distortion due to stress or the like caused by the deposition process by the improvement in the regularity of the crystal lattices. Although it is preferable to perform the heat treatment in the atmosphere after the formation of the oxide antiferromagnetic layer 50, the effect is large even in the vacuum, and thus, at least after the formation of the oxide antiferromagnetic layer 50, the heat treatment may be performed at temperature of 100° C. to 300° C. in a desired step.

The magnetic multilayered film, the magnetoresistance effect element and the magnetoresistance device (for example, MR head) according to the present invention will be described in more detail using the following examples. First, an example of the magnetic multilayered film 1 according to the present invention will be shown.

EXAMPLE 1

The magnitude of the unidirectional magnetic field Hua due to exchange coupling at the interface between the oxide antiferromagnetic layer and the pinned ferromagnetic layer according to the present invention was examined. First, using an RF sputtering machine, various FeOx films each having 50 nm in thickness were formed on CORNING 7059 glass substrates under film deposition conditions as shown below and in Table 1.

Film Deposition Condition of FeOx Film

Ultimate Pressure: $1\times10^{-4}$ Pa

Introduced Gas: Ar and 10 to 40% oxygen, 5 SCCM

Sputtering Pressure: 1 Pa

Applied Power: 50 to 200 W

Target: sintering $Fe_2O_3$ (4 inches φ)

Film Deposition Rate: 0.01 to 0.05 nm/sec

Thereafter, each of the samples was once taken out to the atmosphere and then set in an ion-beam sputtering machine. After applying Ar ion etching to the surface of the FeOx film to remove moisture adsorbed thereto, an NiFe film (10 nm) and a Ta film (10 nm) were successively formed on the etched surface so as to produce a tri-layer film composed of FeOx (50 nm)/NiFe (10 nm)/Ta (10 nm). Then, the relationship among the surface roughness Ra, the crystal grain size D and the unidirectional magnetic field Hua was examined. The processing condition of the Ar ion etching, the film deposition condition of the NiFe film and the Ta film and the film characteristic evaluation method for the samples are shown below.

Ar Ion Etching Condition

Ultimate Pressure: $2\times10^{-5}$ Pa

Introduced Gas: Ar 10 SCCM

Sputtering Pressure: $2.7\times10^{-2}$ Pa

Beam Voltage: 100 V

Beam Current: 10 mA

Etching Time: 180 sec

NiFe Film and Ta Film Deposition Condition

Ultimate Pressure: $2\times10^{-5}$ Pa

Target: Ni-18atomic %Fe, Ta (7 inches φ)

Introduced Gas: Ar 10 SCCM

Sputtering Pressure: $1.5\times10^{-2}$ Pa

Beam Voltage: 300 V

Beam Current: 30 mA

Film Deposition Rate: NiFe 0.022 nm/sec
    Ta 0.018 nm/sec

Film Characteristic Evaluation Method (1) FeOx Film Composition (O/Fe ratio)

As an analytical sample, the FeOx film of 100 nm in thickness was formed on a Si wafer substrate under the same film deposition condition as that of each sample. Then, the ratio O/Fe of oxygen relative to Fe was derived from X-ray fluorescence analysis. As appreciated, x in the FeOx represents the ratio O/Fe.

(2) Surface Roughness Ra

The surface of each of the FeOx films formed on the same glass substrates for analysis was observed by atomic force microscope (AFM) produced by Seiko Electronics Corporation to derive Ra.

(3) Crystal Grain Size D

D was derived from a half width of the α-$Fe_2O_3$ (104) peak using an X-ray diffraction method. Observation was also performed using a transmission electron microscope (TEM).

(4) Hc, and Hua

Measurement samples for magnetic property were prepared. Each sample had a square shape of 10 mm×10 mm and was measured at an applied magnetic field of 250 Oe using a vibrating sample magnetometer (VSM) produced by Riken Electronics Corporation so as to evaluate Hc and Hua. For the Hua, a deviation of hysteresis loop from the zero magnetic field was examined.

The evaluation results of the samples are shown in Table 1.

TABLE 1

| | Film Deposition Condition | | O₂ Particle | Etching Condition | | | | | | |
|---|---|---|---|---|---|---|---|---|---|---|
| Sample No. | RF Power (W) | Pressure (%) | | Beam (V/mA) | Time (min) | O/Fe Ratio | Ra (nm) | Mean Grain Size D (nm) | Hua (Oe) | Hc (Oe) |
| 1-1 | 100 | 20 | | 100/10 | 3 | 1.43 | 0.30 | 25 | 52 | 26 |
| 1-2 | 150 | 30 | | 100/10 | 5 | 1.45 | 0.25 | 15 | 50 | 21 |
| 1-3 | 200 | 40 | | 100/10 | 1.5 | 1.55 | 0.60 | 10 | 40 | 25 |
| 1-4 | 100 | 10 | | 100/10 | 10 | 1.40 | 0.10 | 40 | 65 | 22 |
| 1-5 * | 50 | 20 | | 100/10 | 3 | 1.42 | 0.25 | 50 | 30 | 35 |
| 1-6 * | 100 | 20 | | 100/10 | 0.5 | 1.42 | 0.65 | 25 | 47 | 48 |

Sample with mark * represents a comparative example outside the present invention.

From Table 1, it is known that, when the Ra is no greater than 0.6 nm and the crystal grain size D is from 10 nm to 40 nm, the larger Hua no less than 40 Oe is obtained and Hua>Hc is satisfied.

Figure 5:
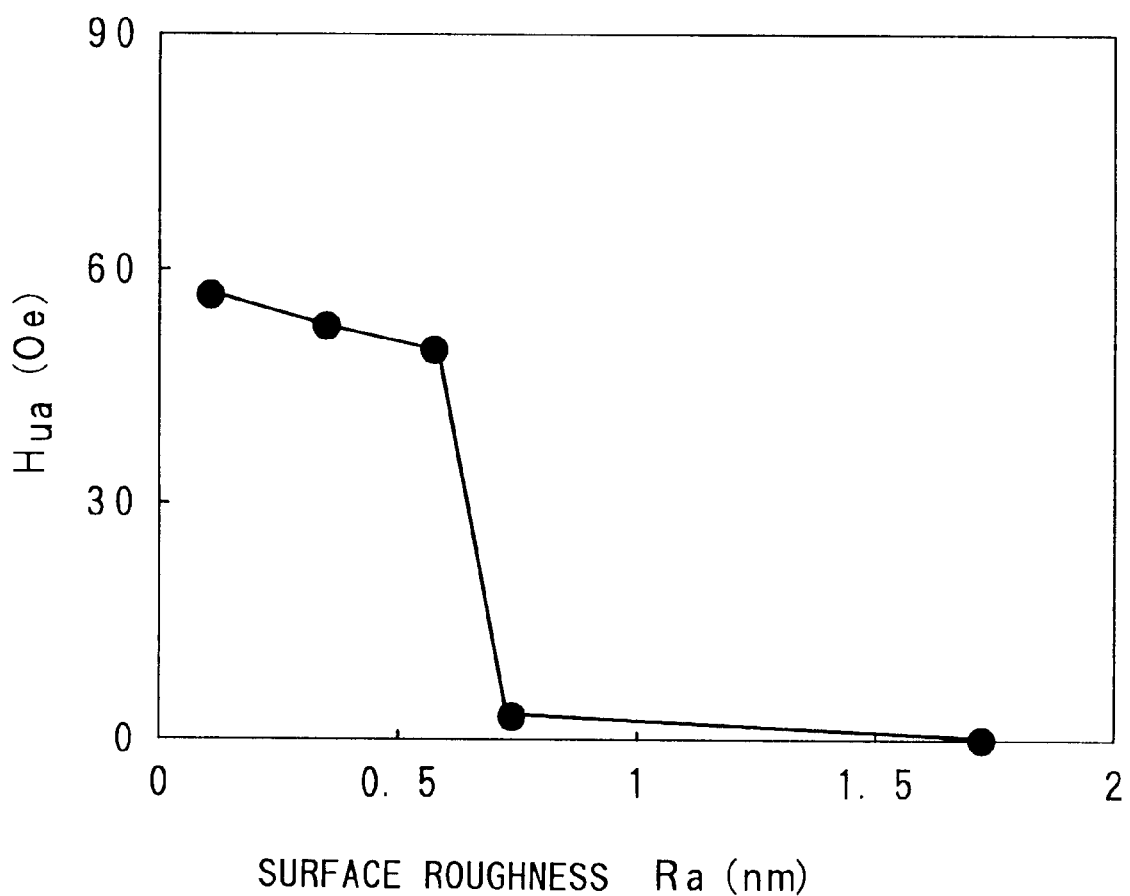
FIG. 5 is a graph showing the relationship between the Hua and the surface roughness when an FeOx antiferromagnetic layer is used according to the present invention.

Now, the FeOx films were formed under the same film deposition condition as that of sample 1-1 except that the sputtering pressure was changed to 0.2 to 10 Pa, so as to produce samples having different surface roughnesses Ra. Thereafter, the surface of each FeOx film was etched under the same condition as that of sample 1-1. Then, the NiFe magnetic layer and the Ta protective layer were formed on the etched surface in order so as to examine the surface roughness dependence of the Hua. The results are shown in FIG. 5. As the sputtering pressure is lowered, the surface roughness Ra of the FeOx film tends to be smaller. From the results shown in FIG. 5, it is known that, when the surface roughness Ra becomes no greater than 0.6 nm, the higher Hua can be achieved.

Figure 6:
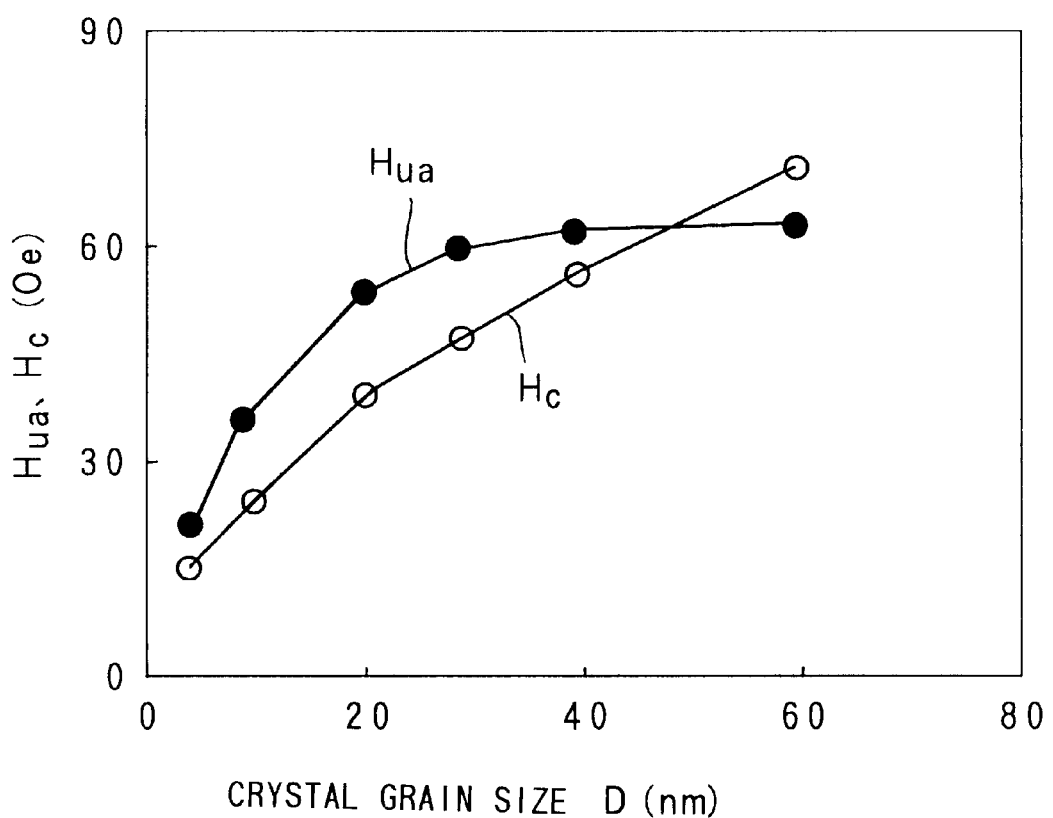
FIG. 6 is a graph showing the relationship between the Hua, Hc and the surface roughness when an FeOx antiferromagnetic layer is used according to the present invention.

Further, the FeOx films were formed with RF sputtering power of 300 W and under sputtering pressure of 0.5 Pa by changing oxygen partial pressure to 0 to 50 volume %, so as to produce samples having different crystal grain sizes D. Thereafter, the surface of each FeOx film was etched similar to the above. Then, the NiFe magnetic layer and the Ta protective layer were formed on the etched surface in order so as to examine the crystal grain size dependence of the Hua. The results are shown in FIG. 6. As the oxygen partial pressure is increased, the mean crystal grain size D of the FeOx film tends to be smaller. From the results shown in FIG. 6, as the mean crystal grain size D is reduced, Hua also tends to be smaller. When the value of the mean crystal grain size D is greater than 10 nm, the value of Hua becomes no less than 40 Oe. However, when the value of the mean crystal grain size D exceeds 40 nm, Hc increases so much to provide Hua<Hc, which is not preferable.

From the results shown in Table 1 and FIGS. 5 and 6, it is known that, when Ra≦0.6 nm and D=10 to 40 nm, the larger Hua no less than 40 Oe is achieved and Hua>Hc is satisfied.

Now, the FeOx films were formed under the same conditions as those of samples 1-2 to 1-4, respectively, and experiments similar to the above were performed. As a result, it was similarly confirmed that, when Ra≦0.6 nm and D=10 to 40 nm, the larger Hua no less than 40 Oe was achieved and Hua>Hc was satisfied.

EXAMPLE 2

Using an RF sputtering machine, various FeOx films as shown in Table 2 were formed on CORNING 7059 glass substrates corresponding to EXAMPLE 1.

Thereafter, each of the samples was once taken out to the atmosphere and then set in an ion-beam sputtering device. After applying Ar ion etching, a pinned ferromagnetic layer, a non-magnetic metal layer, a free ferromagnetic layer and a protective layer were successively formed so as to produce a magnetic multilayered film which exhibits the spin valve type MR change. The exchange biasing magnetic field Hex, the MR ratio and the MR sensitivity were examined according to methods shown below. When preparing the samples in EXAMPLE 2, film compositions and thicknesses of the pinned ferromagnetic layer and the free ferromagnetic layer were changed as shown in Table 2.

Figure 7:
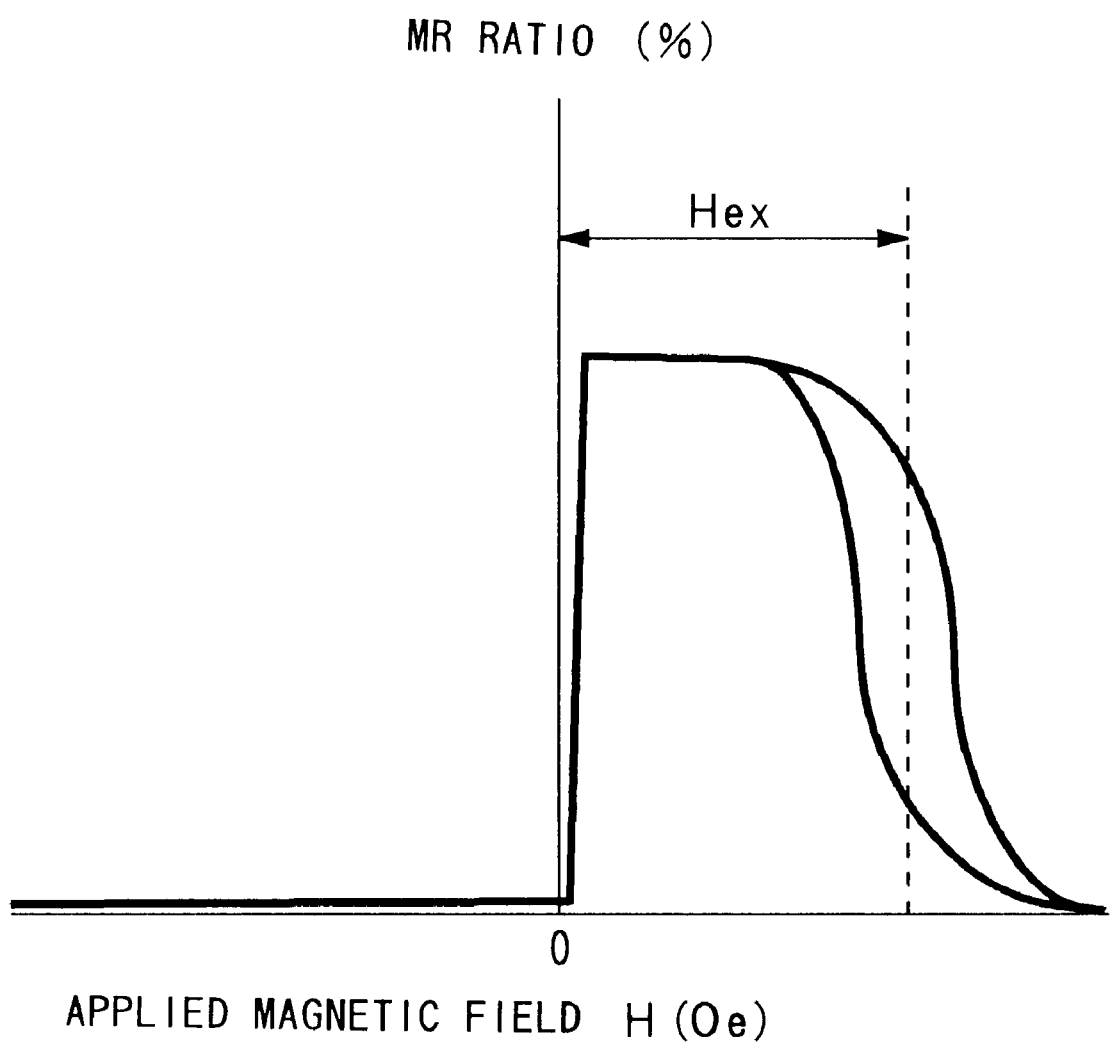
FIG. 7 is a diagram showing a MR curve of a magnetoresistance effect element according to the present invention.

Magnetic Multilayered Film Characteristic Evaluation Method (1) Exchange Biasing Magnetic Field Hex A shift magnetic field of the pinned ferromagnetic layer in the MR curve shown in FIG. 7 was derived as Hex.

(2) MR Ratio and MR Sensitivity

Samples each having a rectangular shape of 0.4 mm×6 mm were prepared. Resistances were measured using a four-terminal method while applying the external magnetic field within the film plane in a direction orthogonal to the current by changing it in the range of −300 Oe to 300 Oe. The minimum resistivity ρsat and the MR ratio ΔR/R were derived from the measured resistances. The MR ratio ΔR/R was derived from the following equation:

$$\Delta R/R = (\rho max - \rho sat) \times 100 / \rho sat \ (\%)$$

wherein ρmax represents the maximum resistivity and ρsat represents the minimum resistivity.

Then, a differential curve of the measured MR curve was derived. The rise-up characteristic was evaluated by taking the maximal value in the vicinity of the zero magnetic field as the MR sensitivity (unit: %/Oe).

The evaluation results of the samples are shown in Table 2.

TABLE 2

| Sample No. | FeOx Layer Thickness (nm) | Ra (nm) | Grain Size D (nm) | Pinned Ferromagnetic Layer | Non-Magnetic Layer | Free Ferromagnetic Layer | Hex (Oe) | MR (%) | MR Sensitivity (%/Oe) |
|---|---|---|---|---|---|---|---|---|---|
| 2-1 | 50 | 0.05 | 25 | Co90Fe10 (1.8 nm) | Cu (2.2 nm) | Ni80Fe20 (7.7 nm) | 210 | 3.5 | 1.9 |
| 2-2 | 50 | 0.20 | 30 | Co90Fe10 (1.9 nm) | Cu (2.5 nm) | Ni80Fe20 (6.5 nm) | 205 | 3.3 | 1.6 |
| 2-3 | 50 | 0.60 | 10 | Co (1.5 nm) | Cu (2.7 nm) | Ni66Fe18Co16 (5.0 nm) | 220 | 3.7 | 1.5 |
| 2-4 | 50 | 0.30 | 40 | Co (1.5 nm) | Cu (2.5 nm) | Co45Fe31Ni24 (6.5 nm) | 230 | 4.0 | 1.5 |
| 2-5 * | 50 | 0.65 | 25 | Co90Fe10 (1.9 nm) | Cu (2.2 nm) | Ni80Fe20 (6.7 nm) | 140 | 1.5 | 0.5 |
| 2-6 * | 50 | 0.25 | 50 | Co (1.5 nm) | Cu (2.5 nm) | Ni66Fe18Co16 (7.7 nm) | 150 | 1.3 | 0.7 |

Sample with mark * represents a comparative example outside the present invention.

From Table 2, it is known that, when the surface roughness Ra of the FeOx film is no greater than 0.6 nm and the crystal grain size D of the FeOx film is 10 nm to 40 nm and further the thickness of the pinned ferromagnetic layer is optimized, the larger Hex greater than 200 Oe which is practically required for the MR head, as well as the large MR ratio and sensitivity can be achieved.

EXAMPLE 3

Using an RF sputtering machine, various NiO films each having 100 nm in thickness were formed on CORNING 7059 glass substrates under film forming conditions as shown below and in Table 3.

Film Deposition Condition of NiO Film

Ultimate Pressure: $1 \times 10^{-4}$ Pa

Introduced Gas: Ar and 5 to 50% oxygen, 5 SCCM

Sputtering Pressure: 0.2 to 10 Pa

Applied Power: 200 W

Target: sintering NiO (4 inches φ)

Film Deposition Rate: 0.02 nm/sec

Thereafter, each of the samples was once taken out to the atmosphere and then set in an ion-beam sputtering device. After applying ion etching under Ar-20% oxygen mixture gas to the surface of the NiO film, a CoFe film (5 nm) and a Ta film (10 nm) were successively formed on the etched surface so as to produce a tri-layer film composed of NiO (100 nm)/CoFe (5 nm)/Ta (10 nm). By changing the NiO film deposition condition and the ion etching condition to thereby change the surface roughnesses Ra and the crystal grain sizes D of the NiO films, various samples as shown in Table 3 were produced and the relationship between the surface roughness Ra and Hua was examined. The ion etching condition and the film deposition condition of the CoFe film and the Ta film are shown below.

Ar-20% Oxygen Mixture Gas Ion Etching Condition

Ultimate Pressure: $2 \times 10^{-5}$ Pa

Introduced Gas: Ar and 20% oxygen mixture gas, 10 SCCM

Sputtering Pressure: $2.7 \times 10^{-2}$ Pa

Beam Voltage: 100 to 300 V

Beam Current: 10 to 30 mA

Etching Time: 90 sec to 30 min

CoFe Film and Ta Film Deposition Condition

Ultimate Pressure: $2 \times 10^{-5}$ Pa

Target: Co-10 atomic %Fe, Ta (7 inches φ)

Introduced Gas: Ar 10 SCCM

Sputtering Pressure: $1.5 \times 10^{-2}$ Pa

Beam Voltage: 300 V

Beam Current: 30 mA

Film Deposition Rate: CoFe 0.021 nm/sec
Ta 0.018 nm/sec

The samples were evaluated according to a film characteristic evaluation method similar to that of EXAMPLE 1. The evaluation results are shown in Table 3.

TABLE 3

| | Film Deposition Condition | | | Etching Condition | | | | | |
|---|---|---|---|---|---|---|---|---|---|
| Sample No. | Sputtering Pressure (Pa) | RF Power (W) | $O_2$ Partial Pressure (%) | Beam (V/mA) | Time (min) | Ra (nm) | Mean Grain Size D (nm) | Hua (Oe) | H (Oe) |
| 3-1 | 0.5 | 200 | 40 | 100/10 | 3 | 0.25 | 25 | 50 | 27 |
| 3-2 | 0.5 | 200 | 20 | 100/10 | 3 | 0.30 | 40 | 55 | 30 |
| 3-3 | 1.0 | 200 | 30 | 100/10 | 1.5 | 0.60 | 30 | 63 | 26 |
| 3-4 * | 0.2 | 200 | 40 | 100/10 | 10 | 0.10 | 10 | 60 | 22 |
| 3-5 * | 5.0 | 200 | 10 | 100/10 | 3 | 0.70 | 55 | 20 | 44 |
| 3-6 * | 10.0 | 200 | 20 | 100/10 | 3 | 0.70 | 40 | 20 | 50 |
| 3-7 * | 0.5 | 200 | 5 | 100/10 | 2 | 0.30 | 60 | 50 | 55 |

Sample with mark * represents a comparative example outside the present invention.

From Table 3, it is known that, when Ra=0.1 nm to 0.6 nm and D=10 nm to 40 nm, the larger Hua no less than 50 Oe is achieved and Hua>Hc is satisfied.

EXAMPLE 4

Using an RF sputtering machine, various NiO films as shown in Table 4 were formed on CORNING 7059 glass substrates corresponding to EXAMPLE 3.

Thereafter, each of the samples was once taken out to the atmosphere and then set in an ion-beam sputtering machine. After applying ion etching, a pinned ferromagnetic layer, a non-magnetic metal layer, a free ferromagnetic layer and a protective layer were successively formed so as to produce a magnetic multilayered film which exhibits the spin valve type MR change. Then, the exchange biasing magnetic field Hex, the MR ratio and the MR sensitivity were examined. When preparing the samples in EXAMPLE 4, film compositions and thicknesses of the pinned ferromagnetic layer, the free ferromagnetic layer and the non-magnetic metal layer were changed as shown in Table 4. The samples were evaluated according to a film characteristic evaluation method similar to that of EXAMPLE 2. The evaluation results are shown in Table 4.

crystal grain size D of the NiO film is 10 nm to 40 nm and further the thickness of the pinned ferromagnetic layer is optimized, the larger Hex greater than 200 Oe which is practically required for the MR head, as well as the large MR ratio and sensitivity can be achieved.

EXAMPLE 5

According to a method similar to that of EXAMPLE 2, various $(Co_{1-y}Ni_y)O$ oxide antiferromagnetic films (layers) were formed using $(Co_{1-y}Ni_y)O$ targets of various compositions.

Thereafter, each of the samples was once taken out to the atmosphere and then set in an ion-beam sputtering machine. After applying ion etching, a pinned ferromagnetic layer, a non-magnetic metal layer, a free ferromagnetic layer and a protective layer were successively formed so as to produce a magnetic multi layer film which exhibits the spin valve type MR change. Then, the exchange biasing magnetic field Hex, the MR ratio and the MR sensitivity were examined. When preparing the samples in EXAMPLE 5, film compositions and thicknesses of the pinned ferromagnetic layer, the free ferromagnetic layer and the non-magnetic metal layer were changed as shown in Table 5. The samples were

TABLE 4

| Sample No. | NiO Layer | | | Pinned Ferromagnetic Layer | Non-Magnetic Layer | Free Ferromagnetic Layer | Hex (Oe) | MR (%) | MR Sensitivity (%/Oe) |
|---|---|---|---|---|---|---|---|---|---|
| | Thickness (nm) | Ra (nm) | Grain Size D (nm) | | | | | | |
| 4-1 | 40 | 0.25 | 25 | Co90Fe10 (1.8 nm) | Cu (2.2 nm) | Ni80Fe20 (7.7 nm) | 215 | 3.2 | 1.8 |
| 4-2 | 40 | 0.20 | 30 | Co90Fe10 (1.8 nm) | Cu (2.7 nm) | Ni80Fe20 (7.7 nm) | 205 | 3.2 | 1.8 |
| 4-3 | 40 | 0.10 | 10 | Co (2.0 nm) | Cu (2.5 nm) | Ni66Fe18Co16 (7.7 nm) | 210 | 3.7 | 1.6 |
| 4-4 | 40 | 0.60 | 40 | Co (2.0 nm) | Cu (2.5 nm) | Co45Fe31Ni24 (8.5 nm) | 210 | 5.0 | 1.5 |
| 4-5 * | 40 | 0.65 | 60 | Co90Fe10 (1.9 nm) | Cu (2.2 nm) | Ni80Fe20 (7.7 nm) | 120 | 1.3 | 0.4 |
| 4-6 * | 40 | 0.65 | 30 | Co (2.0 nm) | Cu (2.2 nm) | Ni80Fe20 (6.5 nm) | 100 | 1.3 | 0.5 |
| 4-7 * | 40 | 0.20 | 60 | Co90Fe10 (1.9 nm) | Cu (2.2 nm) | Ni80Fe20 (8.5 nm) | 220 | 3.0 | 0.5 |

Sample with mark * represents a comparative example outside the present invention.

From Table 4, it is known that, when the surface roughness Ra of the NiO film is no greater than 0.6 nm and the evaluated according to a film characteristic evaluation method similar to that of EXAMPLE 2. The evaluation results are shown in Table 5.

TABLE 5

| Sample No. | $(Co_{1-y}Ni_y)O$ Layer | | | Pinned Ferromagnetic Layer | Non-Magnetic Layer | Free Ferromagnetic Layer | Hex (Oe) | MR (%) | MR Sensitivity (%/Oe) |
|---|---|---|---|---|---|---|---|---|---|
| | Thickness (nm) | Ra (nm) | Grain Size D (nm) | | | | | | |
| 5-1 | y = 0.8 (50 nm) | 0.25 | 25 | Co90Fe10 (3.0 nm) | Cu (2.2 nm) | Ni80Fe20 (8.5 nm) | 250 | 3.3 | 2.0 |
| 5-2 | y = 0.6 (50 nm) | 0.20 | 30 | Co90Fe10 (2.7 nm) | Cu (2.7 nm) | Ni80Fe20 (10 nm) | 260 | 3.3 | 2.2 |
| 5-3 | y = 0.3 (80 nm) | 0.10 | 10 | Co (3.5 nm) | Cu (2.5 nm) | Ni66Fe18Co16 (8.0 nm) | 240 | 3.1 | 1.8 |
| 5-4 * | y = 0.4 (50 nm) | 0.70 | 50 | Co (3.5 nm) | Cu (2.7 nm) | Co45Fe31Ni24 (7.7 nm) | 120 | 1.2 | 0.5 |
| 5-6 * | y = 0.8 (50 nm) | 0.80 | 30 | Co (3.5 nm) | Cu (2.7 nm) | Ni80Fe20 (8.0 nm) | 100 | 1.0 | 0.5 |

TABLE 5-continued

| | $(Co_{1-y}Ni_y)O$ Layer | | | Pinned | Non- | Free | | | MR |
|---|---|---|---|---|---|---|---|---|---|
| Sample No. | Thickness (nm) | Ra (nm) | Grain Size D (nm) | Ferromagnetic Layer | Magnetic Layer | Ferromagnetic Layer | Hex (Oe) | MR (%) | Sensitivity (%/Oe) |
| 5-7 * | y = 0.8 (50 nm) | 0.25 | 50 | Co (3.5 nm) | Cu (2.7 nm) | Ni80Fe20 (8.0 nm) | 230 | 3.0 | 0.5 |

Sample with mark * represents a comparative example outside the present invention.
For $(Co_{1-y}Ni_y)O$ layer, y value is determined to identify composition.

From Table 5, it is known that, when the surface roughness Ra of the $(Co_{1-y}Ni_y)O$ film is no greater than 0.6 nm and the crystal grain size D of the $(Co_{1-y}Ni_y)O$ film is 10 nm to 40 nm and further the thickness of the pinned ferromagnetic layer is optimized, the large Hex greater than 200 Oe which is practically required for the MR head, as well as the large MR ratio and sensitivity can be achieved.

EXAMPLE 6

On an AlTiC substrate was formed an alumina film (10 μm in thickness) on which a multilayered film of FeOx (50 nm)/NiFe (2 nm)/Cu (2.5 nm)/NiFe (5 nm)/Ta (10 nm) was formed according to a method similar to that of EXAMPLE 2.

Figure 8:
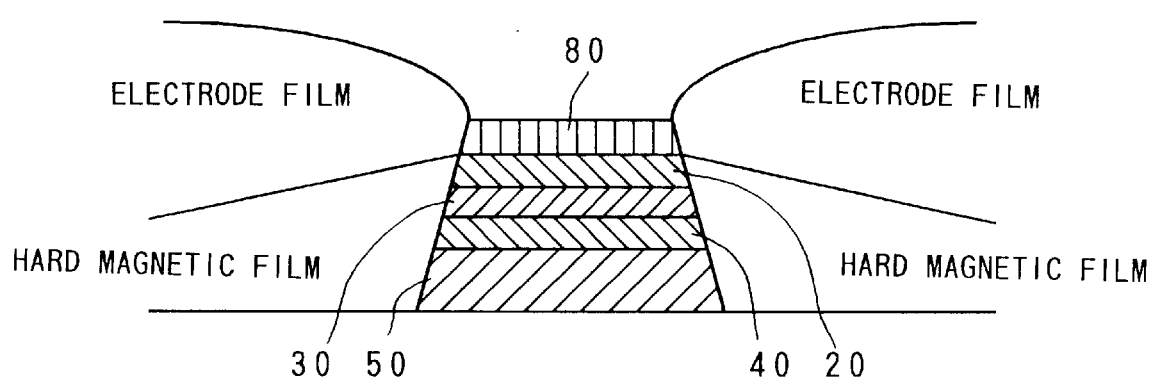
FIG. 8 is a schematic cross-sectional view showing an example of a magnetoresistance effect element according to the present invention.
Figure 9:
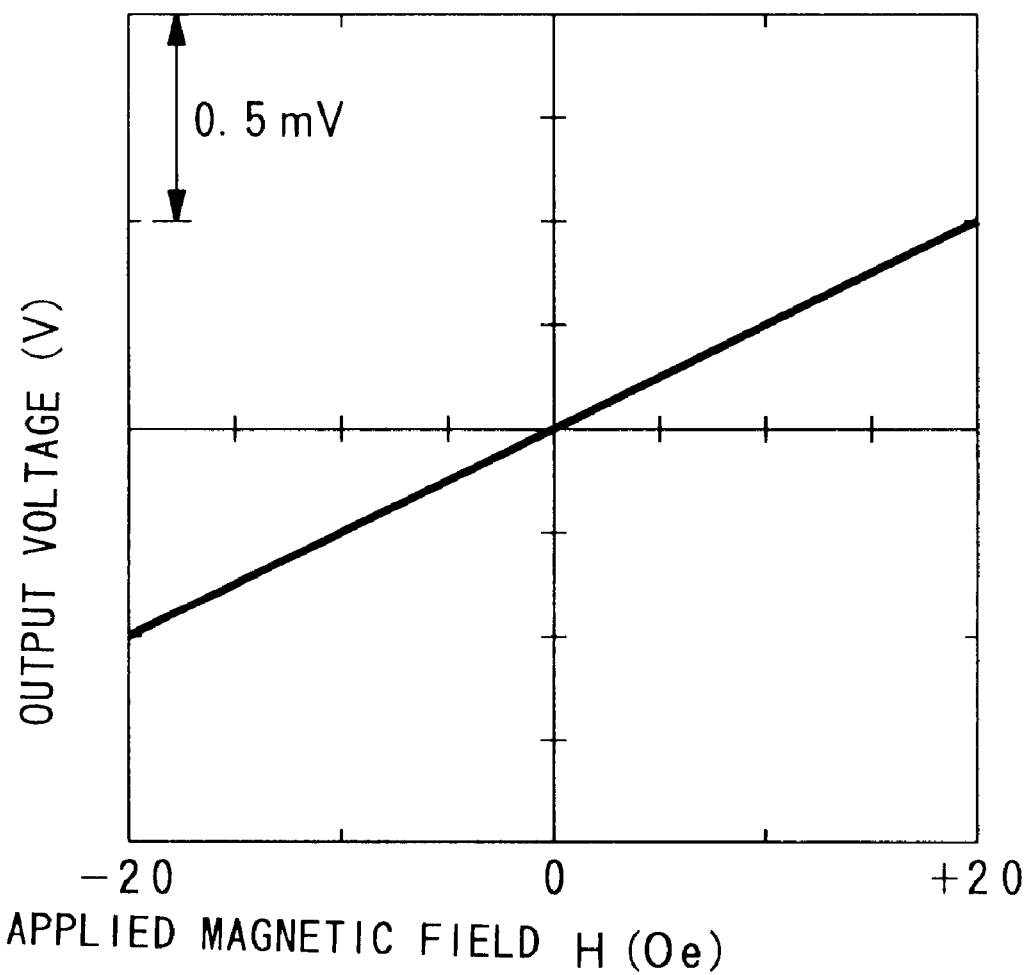
FIG. 9 is a diagram showing the relationship between applied magnetic field and output voltage of a magnetoresistance effect element according to the present invention.

Then, a stripe pattern of 2 μm long and 1 μm width was formed as a magnetically-sensitive portion using a photolithography technique, and CoPt hard magnetic films for magnetic domain control and Au electrode films (with Cr buffer layer) were formed at both ends of the magnetically-sensitive portion using a lift-off technique, so as to produce a magnetoresistance effect element of 2 μm long and 1 μm width. FIG. 8 is a schematic sectional view of the produced magnetoresistance effect element. Thereafter, in an atmosphere at $10^{-5}$ Torr in vacuum, the magnetoresistance effect element was cooled from 220° C. in the magnetic field while applying a magnetic field of 3 kOe in a direction orthogonal to the measurement current within the film plane so that the pinning effect for the pinned ferromagnetic layer was induced. FIG. 9 shows an MR curve obtained with the measurement current 5 mA, the external magnetic field ±20 Oe and the frequency 50 Hz. From the results shown in FIG. 9, it was confirmed that an output of about 1 mV was obtained in the magnetoresistance effect element using the magnetic multilayered film according to the present invention produced.

COMPARATIVE EXAMPLE 1

An experiment was performed about a comparative example with respect to EXAMPLE 6.

Specifically, as a comparative sample, a magnetoresistance effect element was produced utilizing a conventional anisotropic magnetoresistance effect element. On an AlTiC substrate was formed an alumina film (10 μm in thickness) on which NiFeRh (15 nm)/Ta (10 nm)/NiFe (20 nm)/Ta (5 nm) films were formed using a DC sputtering method, so as to produce a SAL bias-anisotropic magnetoresistance film. Then, similar to EXAMPLE 6, patterning and formation of hard magnetic films and electrode films were carried out using the photolithography technique so as to produce the anisotropic magnetoresistance effect element of 2 μm long and 1 μm width. An output level of 0.3 mV was obtained in the element with the measurement current 5 mA, the external magnetic field ±20 Oe and the frequency 50 Hz. As appreciated, the output level in this comparative example was about ⅓ of that in EXAMPLE 6.

EXAMPLE 7

Now, a magnetoresistance effect type head using a magnetoresistance effect element according to the present invention was produced, and its reproduced output level and waveform were examined. First, a fabrication process thereof will be explained. On an AlTiC substrate, an alumina film (10 μm in thickness) was formed using the RF sputtering method. On the alumina film, a Sendust film of 2 μm in thickness was formed as a lower shield film. Then, it was annealed in a magnetic field at 470° C. and formed into a given shape using a photolithography technique.

Then, as a lower insulation layer of the magnetoresistance effect element, an alumina film (100 nm in thickness) was formed by the RF sputtering method. Subsequently, according to a method similar to that of EXAMPLE 6, a multilayered film of FeOx (50 nm)/$Co_{90}Fe_{10}$ (2 nm)/Cu (2.5 nm)/$Ni_{80}Fe_{20}$ (5 nm)/Ta (10 nm) was formed.

Figure 10:
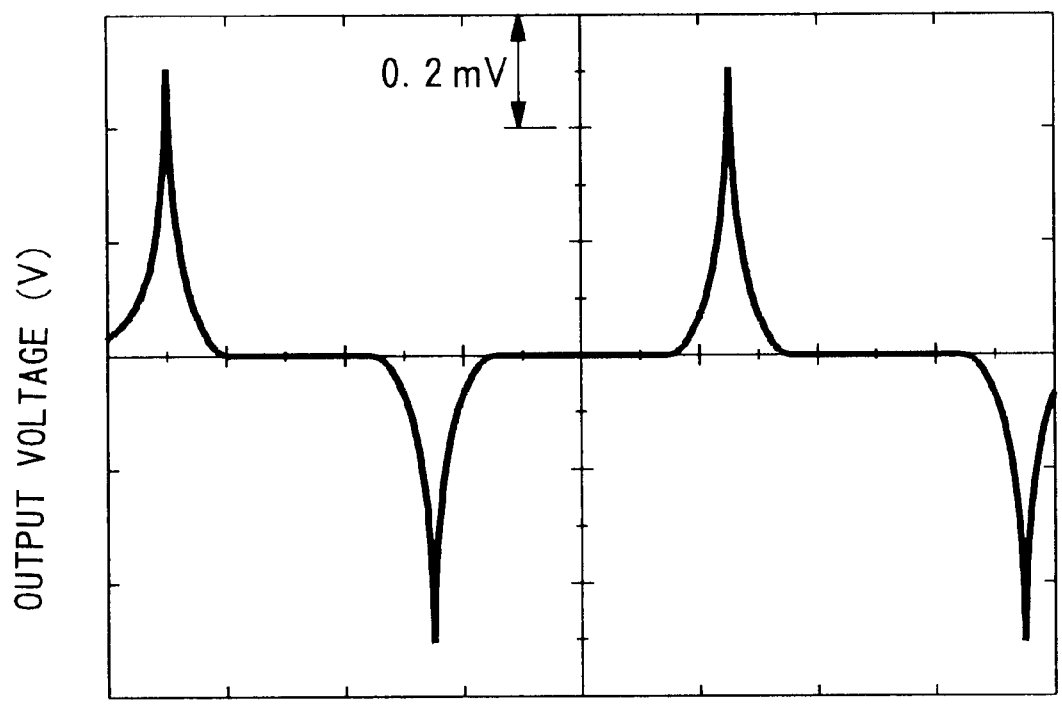
FIG. 10 is a diagram showing output waveform of a magnetoresistance effect type head according to the present invention.

Thereafter, a stripe pattern of 2.5 μm long and 6 μm width was formed as a magnetically-sensitive portion using the photolithography technique, and CoPt hard magnetic films for magnetic domain control and Au electrode films (with Cr buffer layer) were formed at both ends of the magnetically-sensitive portion using the lift-off technique. Then, an alumina film (130 nm in thickness) was formed as an upper insulation layer using the RF sputtering method. Thereafter, Ti (5 nm)/NiFe (100 nm) was formed as a plating buffer layer using the sputtering method, and then, an NiFe film (2 μm in thickness) was formed through plating as an upper shield film and put into a given shape using the photolithography technique. Thereafter, at $10^{-6}$ Torr in a vacuum furnace, the magnetoresistance effect element was annealed at 220° C. and cooled from 220° C. in the magnetic field while applying a magnetic field of 3 kOe in a direction orthogonal to the measurement current within the film plane so that the pinning effect for the pinned ferromagnetic layer was induced. Then, polishing and lapping were carried out to finally fabricate a read only magnetoresistance effect type head having a track width of 2.5 μm, an MR height of 1 μm and a shield gap of 0.3 μm. Using this head, a recording signal written in a CoCrTa magnetic recording medium with a coercive force of 2500 Oe and a thickness of 50 nm was reproduced and its output waveform was examined with the measurement current of 5 mA. FIG. 10 shows the output waveform. As seen from the waveform, no Barkhausen noise was observed, and the excellent waveform with the output of about 1 mVp–p was obtained.

As described above, according to the present invention, since the surface roughness Ra and the crystal grain size D of the oxide antiferromagnetic layer are set to values in the given ranges, respectively, the magentoresistance effect element including the magnetic multilayerded film having the large exchange-coupling magnetic field and MR ratio and sensitivity can be achieved. With this magnetoresistance effect element, the high output level can be obtained.

Further, it is possible to provide the magnetoresistance effect type head which is excellent in current efficieny and capable of detecting signals magnetically recorded in high density, particulary in ultrahigh density exceeding 3 Gbit/inch$^2$ and further obtaining large outputs.

What is claimed is:

1. A magnetic multilayered film comprising an oxide antiferromagnetic layer, a pinned ferromagnetic layer which is pinned by said oxide antiferromagnetic layer, a non-magnetic metal layer and a free ferromagnetic layer which are stacked on a substrate in order, wherein a surface roughness Ra of said oxide anti ferromagnetic layer at a side of said pinned ferromagnetic layer is set to no greater than 0.6 nm, and wherein a crystal grain size D of said oxide antiferromagnetic layer is set to 10 to 40 nm.

2. The magnetic multilayered film according to claim 1, wherein said oxide antiferromagnetic layer is made of FeOx ($1.40 \leq x \leq 1.55$, unit: atomic ratio).

3. The magnetic multilayered film according to claim 1, wherein said oxide antiferromagnetic layer is made of $(Co_{1-y}Ni_y)O$ ($0.3 \leq y \leq 1.0$, unit: atomic ratio).

4. The magnetic multilayered film according to claim 1, wherein said oxide antiferromagnetic layer is a film formed in an atmosphere of Ar and oxygen by an RF sputtering method.

5. The magnetic multilayered film according to claim 1, wherein said pinned ferromagnetic layer has a composition represented by $Co_{100-z}Fe_z$ ($0 \leq z \leq 20$, unit: atomic %).

6. The magnetic multilayered film according to claim 1, wherein said non-magnetic metal layer is made of a material including at lease one selected from the group consisting of Au, Ag and Cu.

7. A magnetoresistance effect element comprising a magnetic multilayered film and electrode portions provided at both ends of said magnetic multilayered film, said magnetic multilayered film comprising an oxide antiferromagnetic layer, a pinned ferromagnetic layer which is pinned by said oxide antiferromagnetic layer, a non-magnetic metal layer and a free ferromagnetic layer which are stacked on a substrate in order, wherein a surface roughness Ra of said oxide antiferromagnetic layer at a side of said pinned ferromagnetic layer is set to no greater than 0.6 nm, and wherein a crystal grain size D of said oxide antiferromagnetic layer is set to 10 to 40 nm.

8. The magnetoresistance effect element according to claim 7, wherein said oxide antiferromagnetic layer is made of FeOx ($1.40 \leq x \leq 1.55$, unit: atomic ratio).

9. The magnetoresistance effect element according to claim 7, wherein said oxide antiferromagnetic layer is made of $(Co_{1-y}Ni_y)O$ ($0.3 \leq y \leq 1.0$, unit: atomic ratio).

10. The magnetoresistance effect element according to claim 7, wherein said oxide antiferromagnetic layer is a film formed in an atmosphere of Ar and oxygen by an RF sputtering method.

11. The magnetoresistance effect element according to claim 7, wherein said pinned ferromagnetic layer has a composition represented by $Co_{100-z}Fe_z$ ($0 \leq z \leq 20$, unit: atomic %).

12. The magnetoresistance effect element according to claim 7, wherein said non-magnetic metal layer is made of a material including at lease one selected from the group consisting of Au, Ag and Cu.

13. A magnetoresistance device comprising a magnetic multilayered film, conductive films and electrode portions, said conductive films electrically connected to said magnetic multilayered film via said electrode portions, respectively, said magnetic multilayered film comprising an oxide antiferromagnetic layer, a pinned ferromagnetic layer which is pinned by said oxide antiferromagnetic layer, a non-magnetic metal layer and a free ferromagnetic layer which are stacked on a substrate in order, wherein a surface roughness Ra of said oxide antiferromagnetic layer at a side of said pinned ferromagnetic layer is set to no greater than 0.6 nm, and wherein a crystal grain size D of said oxide antiferromagnetic layer is set to 10 to 40 nm.

14. The magnetoresistance device according to claim 13, wherein said oxide antiferromagnetic layer is made of FeOx ($1.40 \leq x \leq 1.55$, unit: atomic ratio).

15. The magnetoresistance device according to claim 13, wherein said oxide antiferromagnetic layer is made of $(Co_{1-y}Ni_y)O$ ($0.3 \leq y \leq 1.0$, unit: atomic ratio).

16. The magnetoresistance device according to claim 13, wherein said oxide antiferromagnetic layer is a film formed in an atmosphere of Ar and oxygen by an RF sputtering method.

17. The magnetoresistance device according to claim 13, wherein said pinned ferromagnetic layer has a composition represented by $Co_{100-z}Fe_z$ ($0 \leq z \leq 20$, unit: atomic %).

18. The magnetoresistance device according to claim 13, wherein said non-magnetic metal layer is made of a material including at lease one selected from the group consisting of Au, Ag and Cu.

19. The magnetoresistance device according to claim 13, where in said magneto resistance device is a magnetoresistance effect head.

* * * * *